(12) United States Patent
Chen

(10) Patent No.: US 11,488,907 B2
(45) Date of Patent: Nov. 1, 2022

(54) SEMICONDUCTOR DEVICE WITH PROGRAMMABLE UNIT AND METHOD FOR FABRICATING THE SAME

(71) Applicant: NANYA TECHNOLOGY CORPORATION, New Taipei (TW)

(72) Inventor: Te-Yin Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/107,001

(22) Filed: Nov. 30, 2020

(65) Prior Publication Data

US 2022/0173045 A1 Jun. 2, 2022

(51) Int. Cl.
*H01L 23/538* (2006.01)
*H01L 21/768* (2006.01)
*H01L 23/532* (2006.01)
*H01L 23/525* (2006.01)

(52) U.S. Cl.
CPC .... *H01L 23/5384* (2013.01); *H01L 21/76841* (2013.01); *H01L 23/5252* (2013.01); *H01L 23/5254* (2013.01); *H01L 23/53266* (2013.01)

(58) Field of Classification Search
CPC .............. H01L 23/481; H01L 23/5384; H01L 23/53266; H01L 21/76841; H01L 23/5252; H01L 23/5254
See application file for complete search history.

(56) References Cited

U.S. PATENT DOCUMENTS

| 2021/0013217 A1* | 1/2021 | Yang ................. H01L 27/11206 |
| 2022/0045212 A1* | 2/2022 | Lin ..................... H01L 29/7838 |

\* cited by examiner

*Primary Examiner* — Jaehwan Oh
*Assistant Examiner* — John M Parker
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate, a first conductive layer positioned above the substrate, a bottom conductive layer positioned above the first conductive layer and electrically coupled to the first conductive layer, a programmable insulating layer positioned on the bottom conductive layer, a top conductive layer positioned on the programmable insulating layer, and a redistribution structure positioned above the first conductive layer and electrically coupled to the first conductive layer. The bottom conductive layer, the programmable insulating layer, and the top conductive layer together configure a programmable unit.

14 Claims, 32 Drawing Sheets

SEMICONDUCTOR DEVICE WITH PROGRAMMABLE UNIT AND METHOD FOR FABRICATING THE SAME

TECHNICAL FIELD

The present disclosure relates to a semiconductor device and a method for fabricating the semiconductor device, and more particularly, to a semiconductor device with a programmable unit and a method for fabricating the semiconductor device with the programmable unit.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a first conductive layer positioned above the substrate, a bottom conductive layer positioned above the first conductive layer and electrically coupled to the first conductive layer, a programmable insulating layer positioned on the bottom conductive layer, a top conductive layer positioned on the programmable insulating layer, and a redistribution structure positioned above the first conductive layer and electrically coupled to the first conductive layer. The bottom conductive layer, the programmable insulating layer, and the top conductive layer together configure a programmable unit.

In some embodiments, the bottom conductive layer and the redistribution structure are at a same vertical level.

In some embodiments, the bottom conductive layer and the programmable insulating layer have a same width.

In some embodiments, a width of the programmable insulating layer is equal to or greater than a width of the bottom conductive layer.

In some embodiments, the semiconductor device includes a peak portion positioned on the bottom conductive layer. The programmable insulating layer is positioned on the bottom conductive layer and the peak portion.

In some embodiments, the redistribution structure is at a vertical level higher than a vertical level of the programmable unit.

In some embodiments, the redistribution structure includes a redistribution conductive layer and a thermal release layer. The redistribution conductive layer is positioned above the first conductive layer and electrically coupled to the first conductive layer and the thermal release layer is positioned on the redistribution conductive layer.

In some embodiments, the redistribution conductive layer includes a seed layer and a plating layer. The seed layer is positioned above the first conductive layer and electrically coupled to the first conductive layer and the plating layer is positioned on the seed layer.

In some embodiments, the thermal release layer includes an organic material interstitially mingled with carbon nanotubes.

In some embodiments, the thermal release layer includes a fluoropolymer material interstitially mingled with carbon nanotubes.

In some embodiments, an aspect ratio of the carbon nanotubes is between about 1:1 and about 1:100.

In some embodiments, the semiconductor device includes a barrier layer positioned under the redistribution conductive layer. The barrier layer is formed of titanium, titanium nitride, titanium silicon nitride, tantalum, tantalum nitride, tantalum silicon nitride, or a combination thereof.

In some embodiments, a thickness of the barrier layer is between about 10 angstroms and about 15 angstroms.

In some embodiments, the semiconductor device includes an adjustment layer positioned between the barrier layer and the redistribution conductive layer. The adjustment layer is formed of graphene or graphite.

In some embodiments, the thermal release layer is configured to sustain a thermal resistance between about 0.04° C. cm$^2$/Watt and about 0.25° C. cm$^2$/Watt.

In some embodiments, the redistribution conductive layer is formed of tungsten, titanium, tin, nickel, copper, gold, aluminum, platinum, cobalt, or a combination thereof.

Another aspect of the present disclosure provides a semiconductor device including a substrate, a first conductive layer positioned above the substrate, a second conductive layer positioned at a same vertical level as the first conductive layer, a bottom conductive layer positioned above the second conductive layer and electrically coupled to the second conductive layer, a programmable insulating layer positioned on the bottom conductive layer, a top conductive layer positioned on the programmable insulating layer, and a redistribution structure positioned above the first conductive layer and electrically coupled to the first conductive layer. The bottom conductive layer, the programmable insulating layer, and the top conductive layer together configure a programmable unit.

Another aspect of the present disclosure provides a semiconductor device including a substrate, a first conductive layer positioned above the substrate, a second conductive layer positioned at a same vertical level as the first conductive layer, a redistribution structure including a redistribution overlapping portion positioned on the first conductive layer, a redistribution contact portion positioned on the second conductive layer, and a redistribution connection portion connecting the redistribution overlapping portion and the redistribution connection portion, a programmable insulating layer positioned on the redistribution overlapping portion, and a top conductive layer positioned on the programmable insulating layer. The redistribution overlapping portion, the programmable insulating layer, and the top conductive layer together configure a programmable unit.

Another aspect of the present disclosure provides a method for fabricating a semiconductor device including providing a substrate, forming a first conductive layer above the substrate, concurrently forming a bottom conductive layer and a redistribution structure above the first conductive layer, forming a programmable insulating layer on the bottom conductive layer, and forming a top conductive layer on the programmable insulating layer. The bottom conductive layer, the programmable insulating layer, and the top conductive layer together configure a programmable unit. The bottom conductive layer and the redistribution structure are electrically coupled to the first conductive layer.

In some embodiments, the programmable insulating layer is formed of silicon oxide, silicon nitride, silicon oxynitride, silicon nitride oxide, hafnium oxide, hafnium silicon oxide, hafnium silicon oxynitride, lanthanum oxide, lanthanum aluminum oxide, zirconium oxide, zirconium silicon oxide, zirconium silicon oxynitride, aluminum oxide, or a combination thereof.

Due to the design of the semiconductor device of the present disclosure, the programmable unit and the redistribution structure may be integrated and may be served as a programmable feature of the semiconductor device. In addition, in the presence of the peak portion, the reliability of programming of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
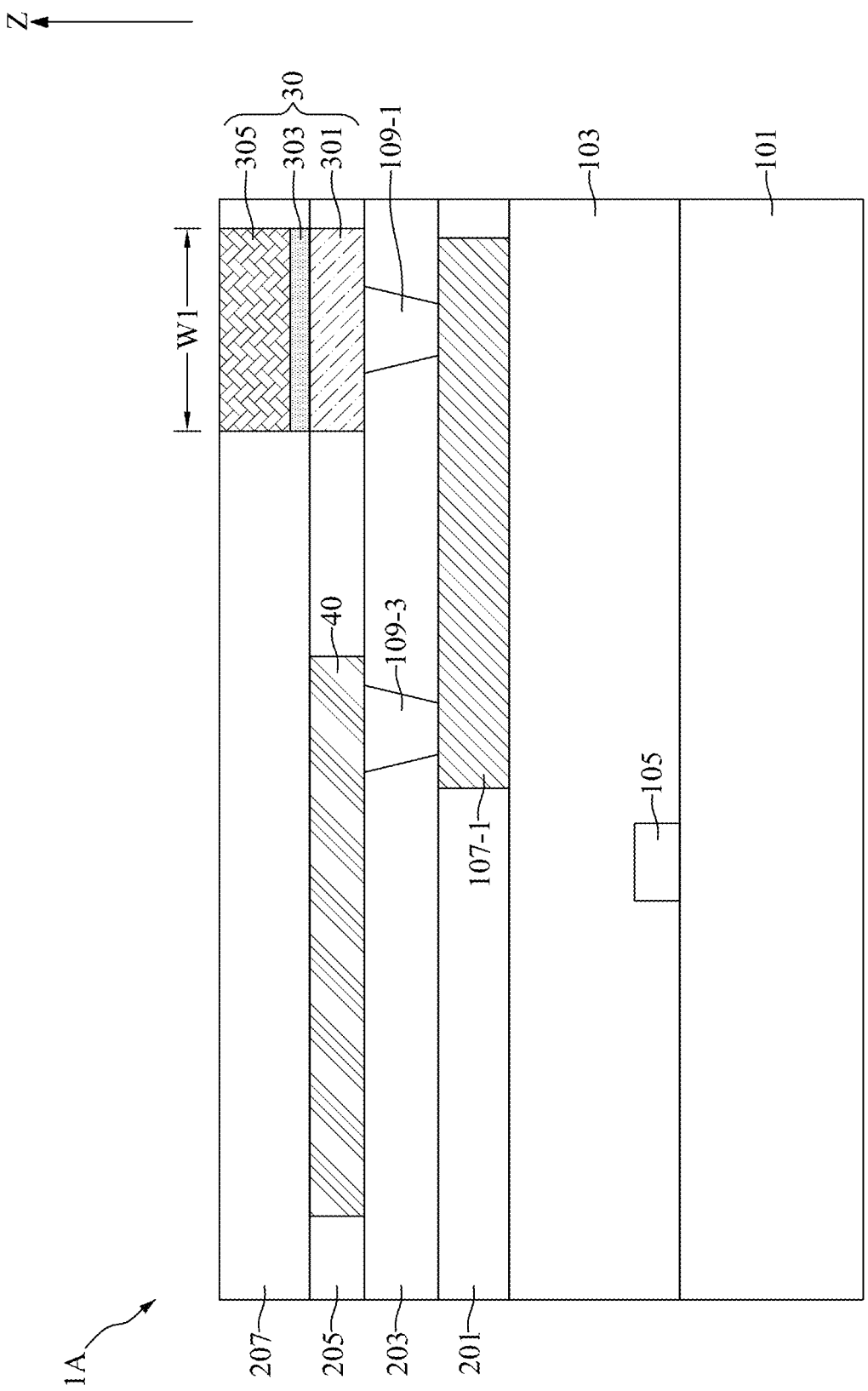
FIGS. 1 to 9 illustrate, in schematic cross-sectional view diagrams, semiconductor devices in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms.

Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

FIG. 1 illustrates, in a schematic cross-sectional view diagram, a semiconductor device 1A in accordance with one embodiment of the present disclosure.

With reference to FIG. 1, the semiconductor device 1A may include a substrate 101, an inter-layer structure 103, device elements 105, a first conductive layer 107-1, a first conductive via 109-1, a second conductive via 109-3, insulating layers 201, 203, 205, 207, a programmable unit 30, and a redistribution structure 40.

With reference to FIG. 1, the substrate 101 may be a bulk semiconductor substrate. The bulk semiconductor substrate may be formed of, for example, an elementary semiconductor such as silicon or germanium or a compound semiconductor such as silicon germanium, silicon carbide, gallium arsenide, gallium phosphide, indium phosphide, indium arsenide, indium antimonide, or other III-V compound semiconductor or II-VI compound semiconductor.

With reference to FIG. 1, the inter-layer structure 103 may be disposed on the substrate 101. The inter-layer structure 103 may include dielectrics, insulating layers, and conductive features disposed on the bulk semiconductor substrate. The dielectrics or the insulating layers may include, for example, a semiconductor oxide, a semiconductor nitride, semiconductor oxynitride, semiconductor carbide, tetraethyl orthosilicate oxide, phosphosilicate glass, borophosphosilicate glass, fluorinated silica glass, carbon doped silicon oxide, amorphous fluorinated carbon, or combinations thereof. The conductive features may be conductive lines, conductive vias, conductive contacts, or the like. The dielectrics or the insulating layers may act as an insulator that supports and electrically isolates the conductive features.

In some embodiments, the device elements 105 (only shown one for clarity) may be disposed in the inter-layer structure 103. The device elements 105 may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices.

With reference to FIG. 1, the insulating layers 201, 203, 205, 207 may be stacked on the inter-layer structure 103. In some embodiments, the insulating layers 201, 203, 205, 207 may be formed of, for example, a semiconductor oxide, a semiconductor nitride, semiconductor oxynitride, semiconductor carbide, tetraethyl orthosilicate oxide, phosphosilicate glass, borophosphosilicate glass, fluorinated silica glass, carbon doped silicon oxide, amorphous fluorinated carbon, or combinations thereof. In some embodiments, the insulating layers 201, 203, 205, 207 may be formed of, for example, silicon oxide, silicon nitride, silicon oxynitride, silicon oxide nitride, polyimide, polybenzoxazole, phosphosilicate glass, undoped silica glass, or fluoride silicate glass. In some embodiments, the insulating layers 201, 203, 205, 207 may be passivation layers of the semiconductor device 1A. In some embodiments, the insulating layer 207 may serve as a high vapor barrier in order to prevent moisture from entering from above.

With reference to FIG. 1, the first conductive layer 107-1 may be disposed in the insulating layer 201. The first conductive layer 107-1 may be electrically coupled to the device elements 105 through the conductive features of the inter-layer structure 103. In some embodiments, the first conductive layer 107-1 may be a pad layer of the semiconductor device 1A. In some embodiments, the first conductive layer 107-1 may be formed of, for example, copper, aluminum, titanium, tungsten, the like, or a combination thereof. In some embodiments, the first conductive layer 107-1 may be formed of, for example, aluminum, copper, aluminum-copper alloy, aluminum alloy, or copper alloy.

With reference to FIG. 1, the first conductive via 109-1 and the second conductive via 109-3 may be disposed in the insulating layer 203 and disposed on the first conductive layer 107-1. The first conductive via 109-1 and the second conductive via 109-3 may be respectively electrically connected the first conductive layer 107-1. In some embodiments, the sidewalls of the first conductive via 109-1 and the second conductive via 109-3 may have slanted cross-sectional profiles. In some embodiments, the first conductive via 109-1 and the second conductive via 109-3 may be formed of, for example, tungsten, copper, cobalt, ruthenium, molybdenum, titanium, tin, nickel, gold, aluminum, platinum, or a combination thereof.

With reference to FIG. 1, a programmable unit 30 may be disposed on the first conductive via 109-1. The programmable unit 30 may include a bottom conductive layer 301, a programmable insulating layer 303, and a top conductive layer 305. The bottom conductive layer 301 may be disposed in the insulating layer 205 and disposed on the first conductive via 109-1. The bottom conductive layer 301 may be electrically coupled to the first conductive layer 107-1 through the first conductive via 109-1. The top surface of the bottom conductive layer 301 may be substantially coplanar with the top surface of the insulating layer 205. The bottom conductive layer 301 may be formed of, for example, silicon, germanium, doped silicon, doped silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof.

With reference to FIG. 1, the programmable insulating layer 303 may be disposed on the bottom conductive layer 301 and disposed in the insulating layer 207. The width W1 of the programmable insulating layer 303 may be the same as the width of the bottom conductive layer 301. In some embodiments, the programmable insulating layer 303 may have a thickness between about 5 nm and about 100 nm. The thickness of the programmable insulating layer 303 may determine the programming current or programming voltage thereof during a programming procedure. The programmable insulating layer 303 may be formed of, for example, silicon oxide, silicon nitride, silicon oxynitride, silicon nitride oxide, hafnium oxide, hafnium silicon oxide, hafnium silicon oxynitride, lanthanum oxide, lanthanum aluminum oxide, zirconium oxide, zirconium silicon oxide, zirconium silicon oxynitride, aluminum oxide, or a combination thereof. The programmable insulating layer 303 may electrically insulate or isolate the bottom conductive layer 301 and the top conductive layer 305 before programming the semiconductor device 1A.

With reference to FIG. 1, the top conductive layer 305 may be disposed on the programmable insulating layer 303. The top conductive layer 305 may have a same width as the programmable insulating layer 303. The top surface of the top conductive layer 305 may be substantially coplanar with the top surface of the insulating layer 207. The top conductive layer 305 may be formed of a same material as the bottom conductive layer 301 but is not limited thereto.

With reference to FIG. 1, the redistribution structure 40 may be disposed in the insulating layer 205 and on the second conductive via 109-3. The redistribution structure 40 may be electrically coupled to the first conductive layer 107-1 through the second conductive via 109-3. The top surface of the redistribution structure 40 may be substantially coplanar with the top surface of the bottom conductive layer 301. In some embodiments, the redistribution structure 40 and the bottom conductive layer 301 may be concurrently formed. That is, the redistribution structure 40 may be formed of a same material as the bottom conductive layer 301. The redistribution structure 40 and the bottom conductive layer 301 may be horizontally arranged. In some embodiments, the redistribution structure 40 may be formed of, for example, tungsten, titanium, tin, nickel, copper, gold, aluminum, platinum, cobalt, or a combination thereof.

The redistribution structure 40, the first conductive via 109-1, the first conductive layer 107-1, the first conductive via 109-1, and the programmable unit 30 together configure a programmable feature such as an anti-fuse. An anti-fuse starts with a high resistance and is designed to permanently create an electrically conductive path.

During programming of the semiconductor device 1A, a programming voltage may be provided and applied to the semiconductor device 1A through the redistribution structure 40 and the top conductive layer 305. By applying enough programming voltage, electrical fields induced by the programming voltage may make the programmable insulating layer 303 broken down to form a rupture point of the programmable insulating layer 303. Accordingly, a resistance reduction of the programmable unit 30 may be induced and an electrically conductive path may be permanently created.

FIGS. 2 to 9 illustrate, in schematic cross-sectional view diagrams, semiconductor devices 1B, 1C, 1D, 1E, 1F, 1G, 1H, and 1I in accordance with some embodiments of the present disclosure.

Figure 2:
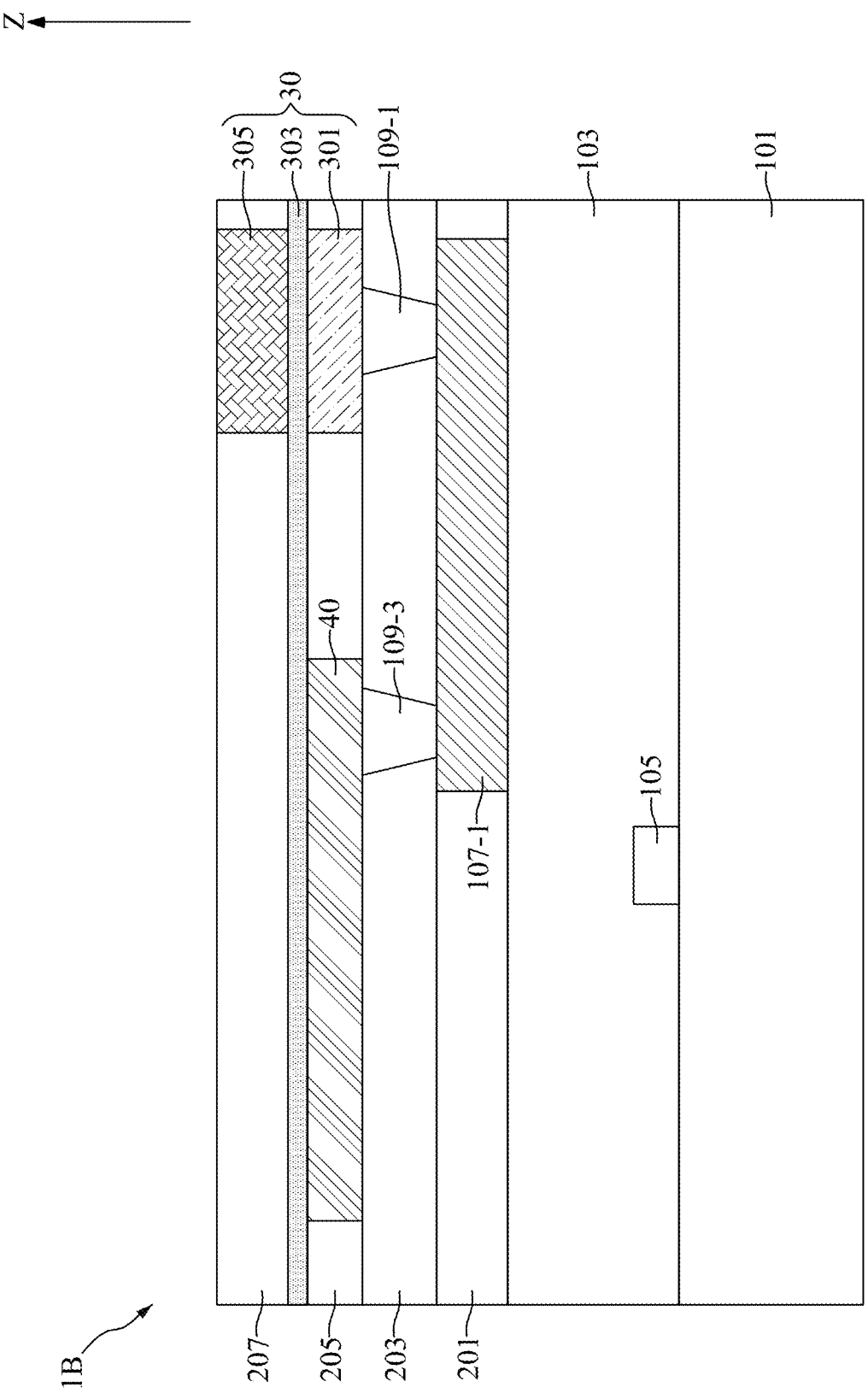

With reference to FIG. 2, the semiconductor device 1B may have a structure similar to that illustrated in FIG. 1. The same or similar elements in FIG. 2 as in FIG. 1 have been marked with similar reference numbers and duplicative descriptions have been omitted.

With reference to FIG. 2, the width of the programmable insulating layer 303 may be greater than the width of the bottom conductive layer 301 and the width of the top conductive layer 305. For example, the programmable insulating layer 303 may be disposed to concurrently cover the bottom conductive layer 301 and a portion of the redistribution structure 40. For another example, the programmable insulating layer 303 may be disposed to cover the whole insulating layer 205.

Figure 3:
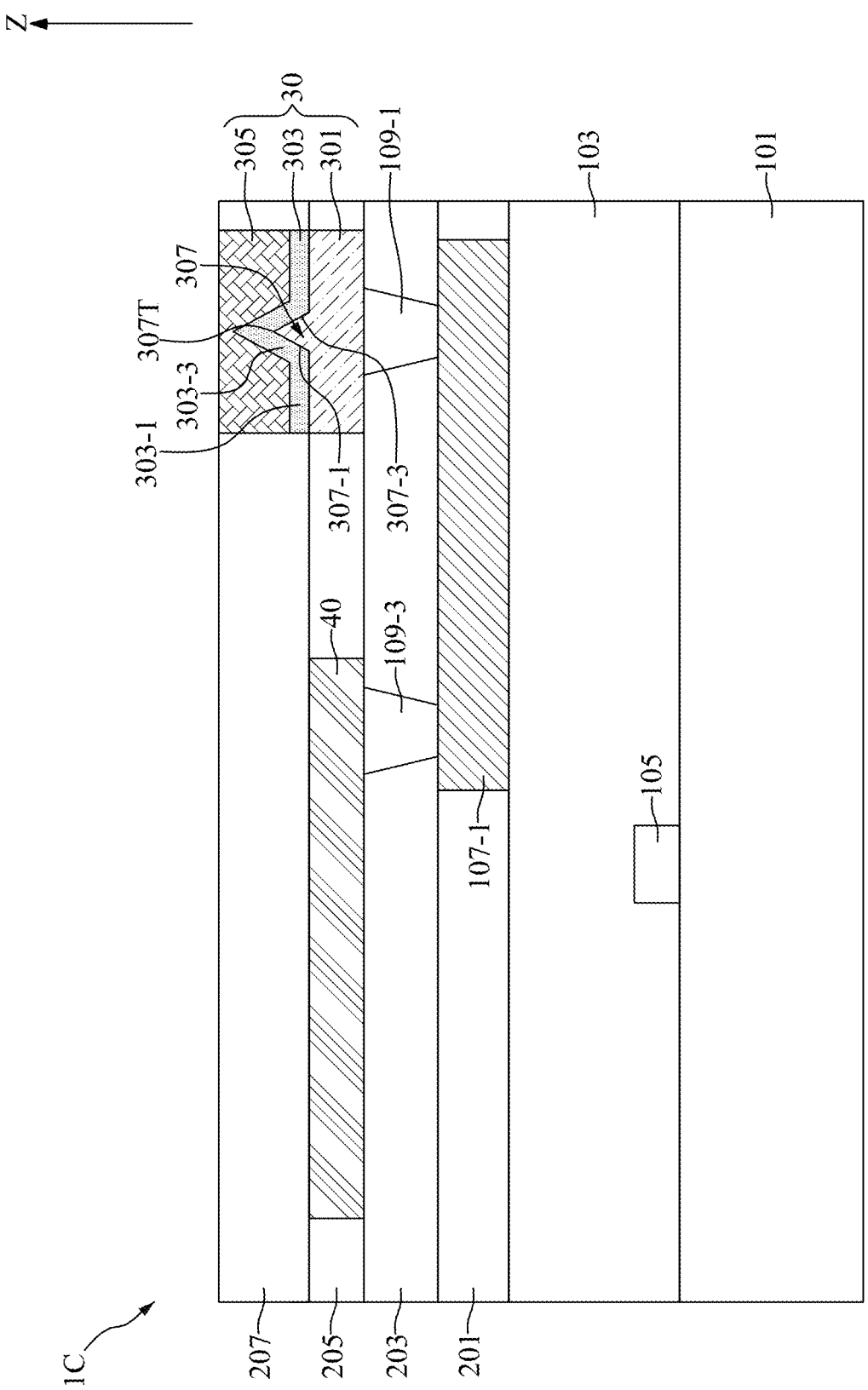

With reference to FIG. 3, the semiconductor device 1C may have a structure similar to that illustrated in FIG. 1. The same or similar elements in FIG. 3 as in FIG. 1 have been marked with similar reference numbers and duplicative descriptions have been omitted.

With reference to FIG. 3, a peak portion 307 may be disposed on the bottom conductive layer 301. The peak portion 307 may have a cross-sectional profile which is a triangular shape and may include a first faceted plane 307-1 and a second faceted plane 307-3 intersecting to each other. In some embodiments, the peak portion 307 may have cross-sectional profile which is a diamond shape, a pentagonal shape, or a shape having more than five sides. The peak portion 307 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials.

With reference to FIG. 3, the programmable insulating layer 303 may be disposed on the peak portion 307. The programmable insulating layer 303 may include two flat portions 303-1 and a capping portion 303-3. The capping portion 303-3 may be disposed on the first faceted plane 307-1 and the second faceted plane 307-3. The two flat portions 303-1 may be respectively correspondingly connected two ends of the capping portion 303-3. The two flat portions 303-1 may be disposed on the top surface of the bottom conductive layer 301. The thickness of the two flat portions 303-1 may be greater than or equal to the thickness of the capping portion 303-3.

During programming of the semiconductor device 1C, the vertex 307T of the peak portion 307 may be the most vulnerable part because electrical fields concentrate at the sharp profile. Since the vertex 307T of the peak portion 307 may obtain the highest electrical fields, the programmable insulating layer 303 may be broken down to form a rupture point of the capping portion 303-3 adjacent to the vertex 307T of the peak portion 307 and a resistance reduction may be induced accordingly. Consequently, the semiconductor device 1C is blown and programmed. The position of the rupture point of the capping portion 303-3 may be easily limited in the place adjacent to the vertex 307T of the peak portion 307 having the highest electrical fields during programming. As result, the reliability of programming of the semiconductor device 1C may be increased.

Figure 4:
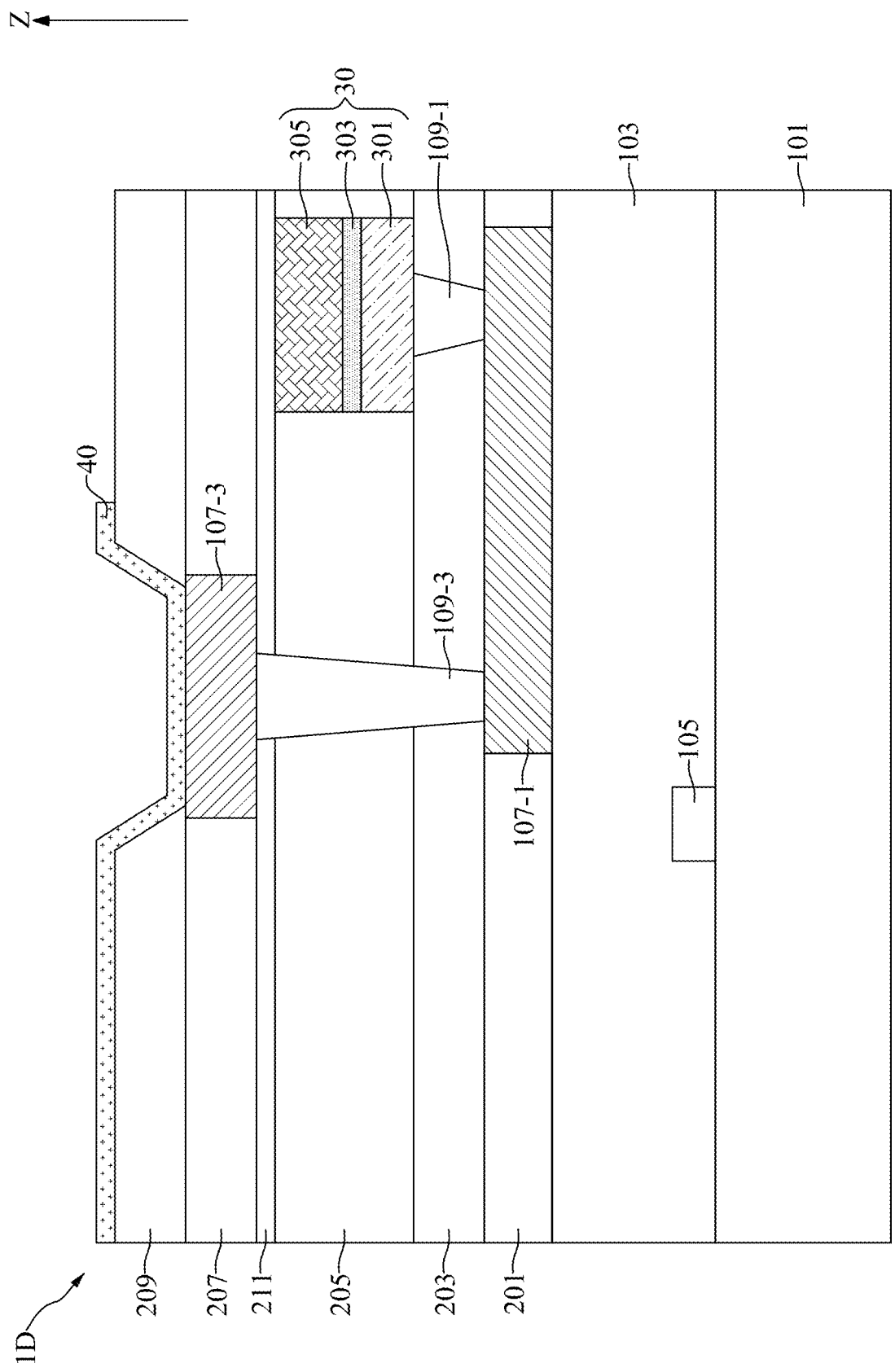

With reference to FIG. 4, in the semiconductor device 1D, the substrate 101, the inter-layer structure 103, the device elements 105, the first conductive layer 107-1, the first conductive via 109-1, the insulating layers 201, 203, and the programmable unit 30 may have similar structures and may be formed of same materials as illustrated in FIG. 1.

With reference to FIG. 4, the insulating layers 205, 207, 209 may be stacked on the insulating layer 203. The programmable unit 30 may be disposed in the insulating layer 205. The top surface of the top conductive layer 305 may be substantially coplanar with the top surface of the insulating layer 205. In some embodiments, the insulating layers 205, 207, 209 may be passivation layers of the semiconductor device 1D. In some embodiments, the insulating layers 205, 207, 209 may be formed of a same material as the insulating layer 203 but are not limited thereto.

With reference to FIG. 4, an intervening layer 211 may be disposed between the insulating layer 205 and the insulating layer 207. In some embodiments, the intervening layer 211 may be an etch stop layer of the semiconductor device 1D. The intervening layer 211 may be formed of, for example, carbon-doped oxide, carbon incorporated silicon oxide, nitrogen-doped silicon carbide, or a combination thereof. In some embodiments, the intervening layer 211 may have a thickness between about 10 nm and about 200 nm. In some embodiments, the thickness of the intervening layer 211 may be set to an arbitrary range depending on the circumstances.

With reference to FIG. 4, a second conductive via 109-3 may be disposed along the intervening layer 211, the insulating layer 205, and the insulating layer 203 and disposed on the first conductive layer 107-1. The second conductive via 109-3 may be electrically connected the first conductive layer 107-1. The second conductive via 109-3 may be formed of a same material as the first conductive via 109-1 but is not limited thereto.

With reference to FIG. 4, a second conductive layer 107-3 may be disposed on the intervening layer 211 and on the second conductive via 109-3. In other words, the second conductive layer 107-3 may be at a vertical level higher than a vertical level of the programmable unit 30. The top surface of the second conductive layer 107-3 may be substantially coplanar with the top surface of the insulating layer 207. A portion of the top surface of the second conductive layer 107-3 may be exposed through an opening of the insulating layer 209. The second conductive layer 107-3 may be formed of a same material as the first conductive layer 107-1 but is not limited thereto. The second conductive layer 107-3 may be electrically coupled to the first conductive layer 107-1 through the second conductive via 109-3.

With reference to FIG. 4, the redistribution structure 40 may be conformally disposed on the second conductive layer 107-3 and the insulating layer 209. That is, the redistribution structure 40 may be at a vertical level higher than a vertical level of the programmable unit 30. The redistribution structure 40 may be electrically coupled to the first conductive layer 107-1 through the second conductive layer 107-3 and the second conductive via 109-3.

During programming of the semiconductor device 1D, a programming voltage may be provided and applied to the semiconductor device 1D through the redistribution structure 40 and the top conductive layer 305. By applying enough programming voltage, electrical fields induced by the programming voltage may make the programmable insulating layer 303 broken down to form a rupture point of the programmable insulating layer 303. Accordingly, a resistance reduction of the programmable unit 30 may be induced and an electrically conductive path may be permanently created.

Figure 5:
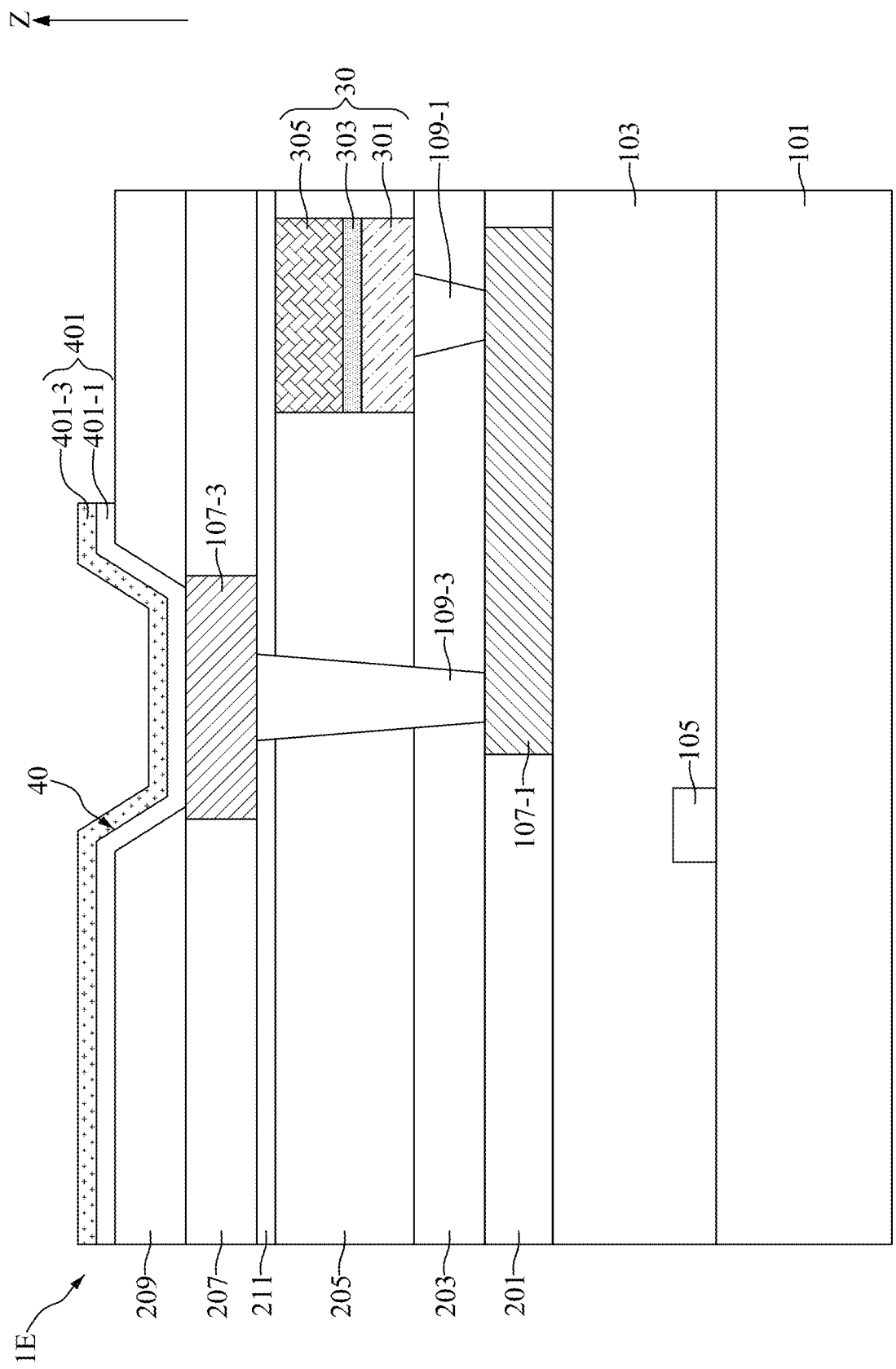

With reference to FIG. 5, the semiconductor device 1E may have a structure similar to that illustrated in FIG. 4. The same or similar elements in FIG. 5 as in FIG. 4 have been marked with similar reference numbers and duplicative descriptions have been omitted.

With reference to FIG. 5, the redistribution structure 40 may include a redistribution conductive layer 401. The redistribution conductive layer 401 may be a stacked layer including a seed layer 401-1 and a plating layer 401-3. The seed layer 401-1 may be conformally disposed on the second conductive layer 107-3 and on the insulating layer 209. The plating layer 401-3 may be disposed on the seed layer 401-1. The plating layer 401-3 may be formed of, for example, tungsten, titanium, tin, nickel, copper, gold, aluminum, platinum, cobalt, or a combination thereof.

Figure 6:
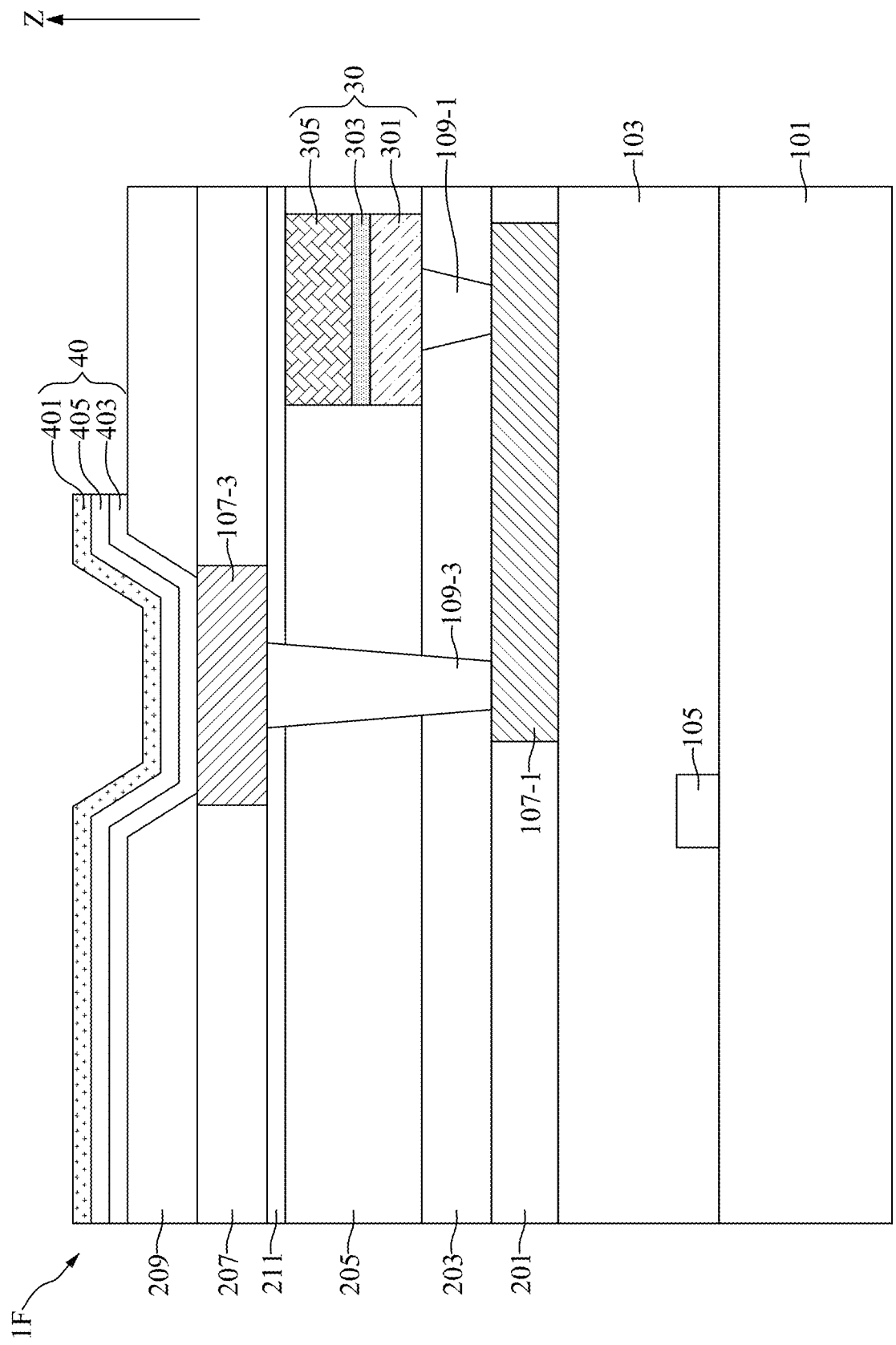

With reference to FIG. 6, the semiconductor device 1F may have a structure similar to that illustrated in FIG. 5. The same or similar elements in FIG. 6 as in FIG. 5 have been marked with similar reference numbers and duplicative descriptions have been omitted.

With reference to FIG. 6, the redistribution structure 40 may include a barrier layer 403, an adjustment layer 405, and the redistribution conductive layer 401. The barrier layer 403 may be conformally disposed on the second conductive layer 107-3 and on the insulating layer 209. In some embodiments, the first barrier layer 401 may have a thickness between about 10 angstroms and about 15 angstroms. The barrier layer 403 may be formed of, for example, titanium, titanium nitride, titanium silicon nitride, tantalum, tantalum nitride, tantalum silicon nitride, or a combination thereof. The barrier layer 403 may serve as an adhesive layer between the second conductive layer 107-3 and the redistribution conductive layer 401.

With reference to FIG. 6, the adjustment layer 405 may be disposed on the barrier layer 403. The redistribution conductive layer 401 may be disposed on the adjustment layer 405. In some embodiments, the adjustment layer 405 may be formed of, for example, graphene, graphite, or the like. In some embodiments, the adjustment layer 405 may be formed of, for example, graphene. As the adjustment layer 405 formed of graphene has excellent electrical conductivity, the resistance between the redistribution conductive layer 401 and the second conductive layer 107-3 can be reduced. Therefore, the power consumption for the semiconductor device 1F may be decreased.

Figure 7:
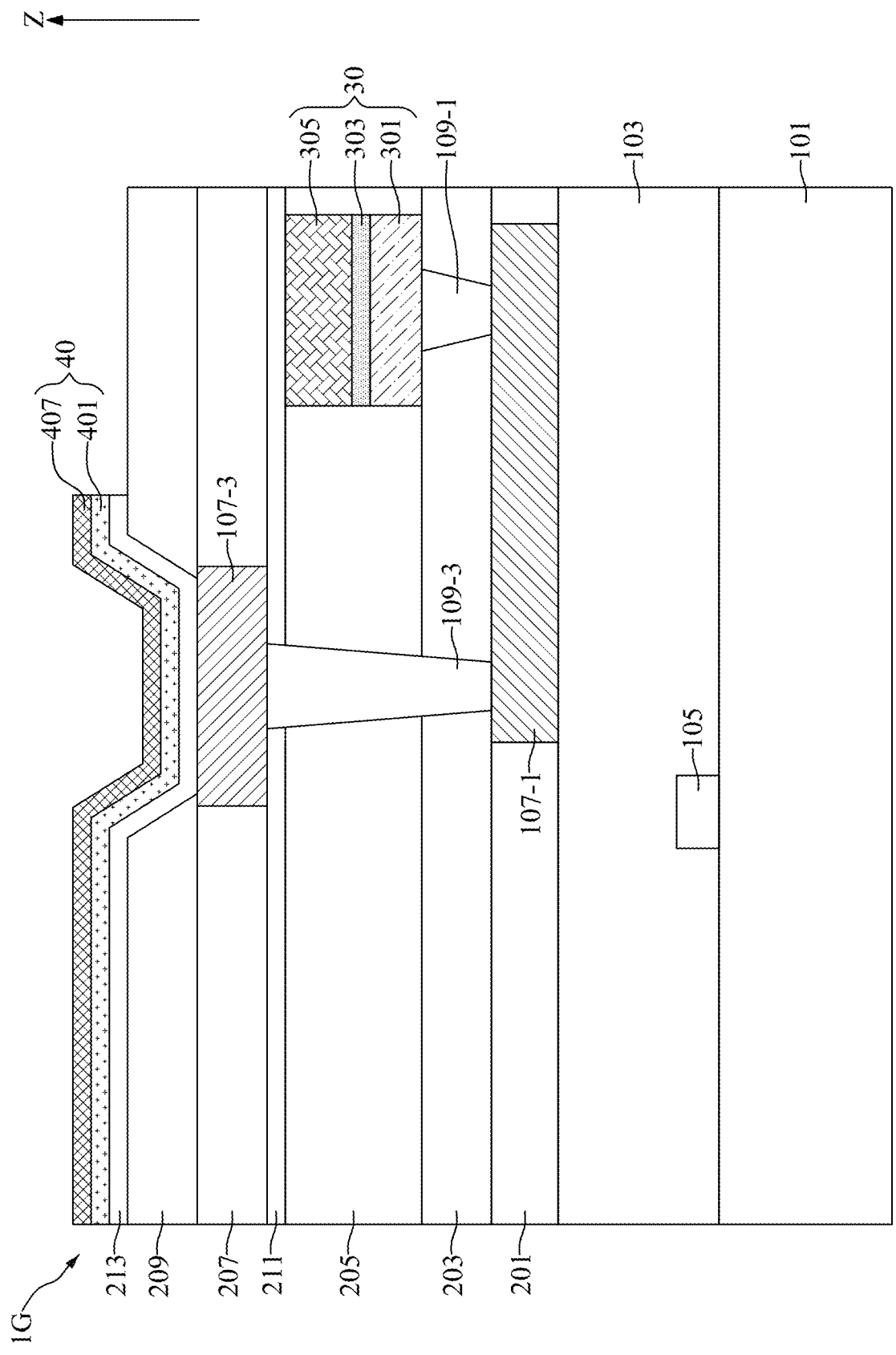

With reference to FIG. 7, the semiconductor device 1G may have a structure similar to that illustrated in FIG. 5. The same or similar elements in FIG. 7 as in FIG. 5 have been marked with similar reference numbers and duplicative descriptions have been omitted.

With reference to FIG. 7, a covering layer 213 may be conformally disposed on the insulating layer 209 to expose the portion of the top surface of the second conductive layer 107-3. The covering layer 213 may provide additional electrically isolate or insulate to the conductive features underlying thereof and the conductive features above thereof. In some embodiments, the covering layer 213 may be formed to include a photosensitive polymer material, such as a polyimide material. In some embodiments, the covering layer 213 may be formed of, for example, silicon oxide, silicon nitride, silicon carbon nitride, silicon nitride oxide, or silicon oxynitride.

With reference to FIG. 7, the redistribution structure 40 may include the redistribution conductive layer 401 and a thermal release layer 407. The redistribution conductive layer 401 may be conformally disposed on the second conductive layer 107-3 and the covering layer 213. The thermal release layer 407 may be disposed on the redistribution conductive layer 401. The thermal release layer 407 may be formed of a carbon material that is imbued with a flexible material such as a polymer matrix. For example, the thermal release layer 407 may include generally vertically oriented graphite and carbon nanotubes, which are imbued with a fluoropolymer rubber matrix. The aspect ratio of the carbon nanotubes may be between about 1:1 and about 1:100. For another example, the thermal release layer 407 may include graphitic carbon.

In some embodiments, a thermal resistance of the thermal release layer 407 may be less than 0.2° C. cm$^2$/Watt at a thickness between about 250 µm and about 450 µm. In some embodiments, the thermal resistance of the thermal release layer 407 may be between about between about 0.04° C. cm$^2$/Watt and about 0.25° C. cm$^2$/Watt. The thermal release layer 407 may improve thermal dissipation capability to the redistribution structure 40.

Figure 8:
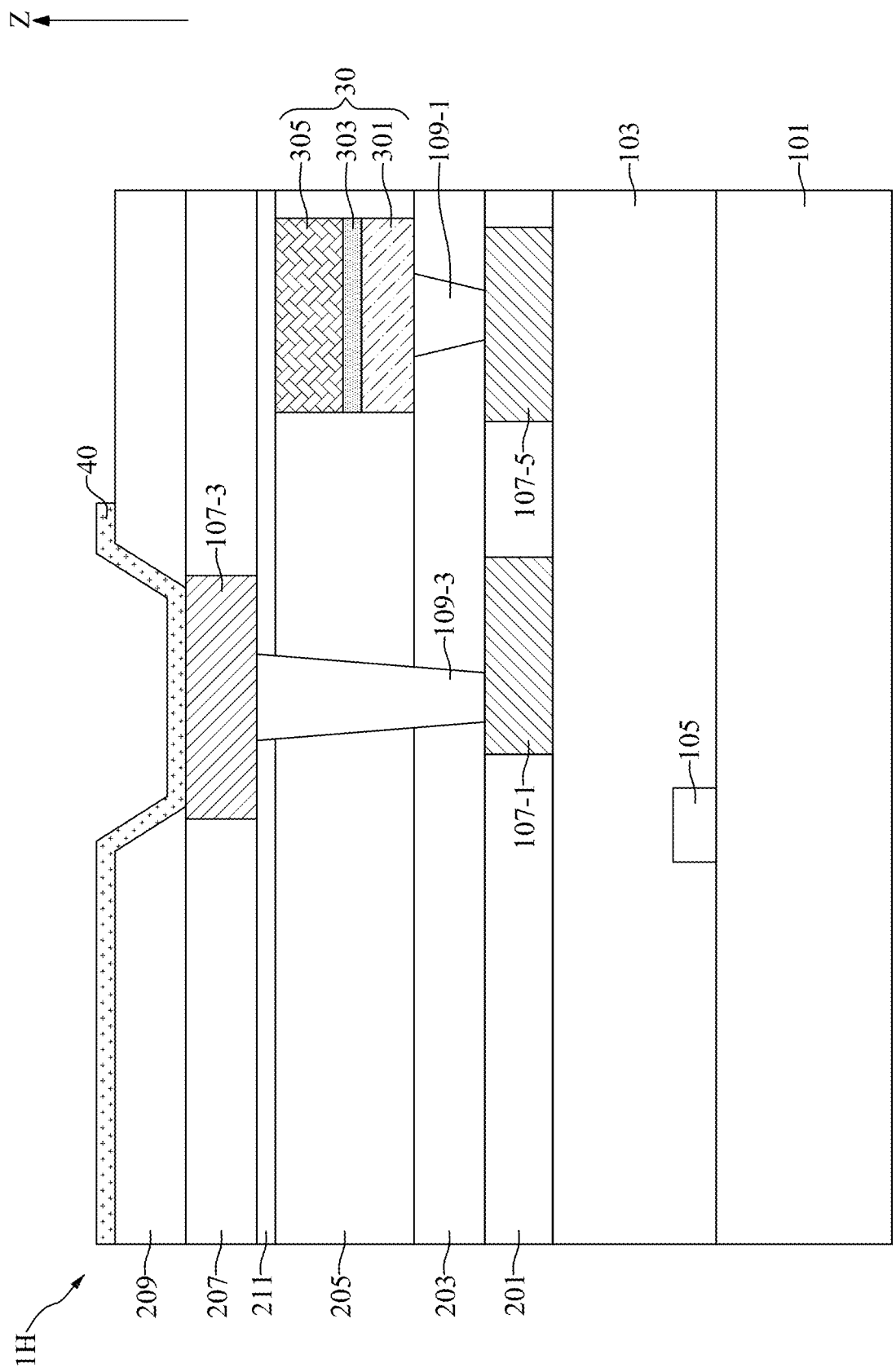

With reference to FIG. 8, the semiconductor device 1H may have a structure similar to that illustrated in FIG. 4. The same or similar elements in FIG. 8 as in FIG. 4 have been marked with similar reference numbers and duplicative descriptions have been omitted.

With reference to FIG. 8, the third conductive layer 107-5 may be disposed in the insulating layer 201. The top surface of the third conductive layer 107-5 may be substantially coplanar with the top surface of the first conductive layer 107-1. The third conductive layer 107-5 may be formed of a same material as the first conductive layer 107-1. The programmable unit 30 may be electrically coupled to the third conductive layer 107-5 through the first conductive via 109-1. The first conductive layer 107-1 and the third conductive layer 107-5 may be electrically coupled through some of the conductive features of the inter-layer structure 103 during the programming procedure.

Figure 9:
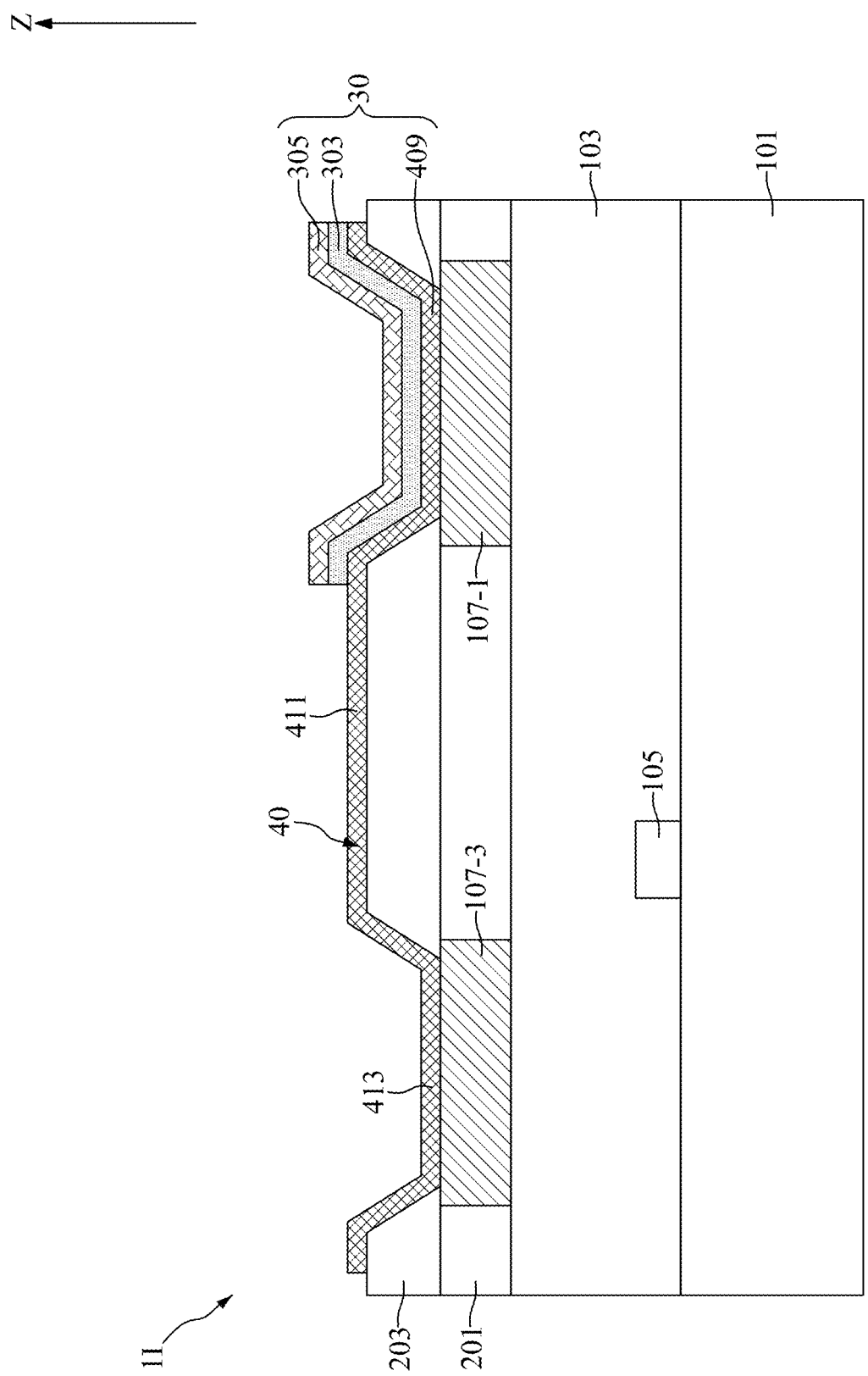

With reference to FIG. 9, in the semiconductor device 1I, the substrate 101, the inter-layer structure 103, the device elements 105, the first conductive layer 107-1, and the insulating layer 201 may have similar structures as illustrated in FIG. 1. A second conductive layer 107-3 may be disposed in the insulating layer 201. The top surface of the second conductive layer 107-3 may be substantially coplanar with the top surface of the first conductive layer 107-1. An insulating layer 203 may be formed on the insulating layer 201 to expose a portion of the top surface of the first conductive layer 107-1 and a portion of the top surface of the second conductive layer 107-3, respectively.

With reference to FIG. 9, a redistribution structure 40 may be conformally disposed on the first conductive layer 107-1, the second conductive layer 107-3, and the insulating layer 203. The redistribution structure 40 may include a redistribution overlapping portion 409, a redistribution connection portion 411, and a redistribution contact portion 413. The redistribution overlapping portion 409 may be disposed on the first conductive layer 107-1. The redistribution contact portion 413 may be disposed on the second conductive layer 107-3. The redistribution connection portion 411 may connect the redistribution overlapping portion 409 and the redistribution contact portion 413. A top conductive layer 305 may be disposed on the redistribution overlapping portion 409.

With reference to FIG. 9, a programmable insulating layer 303 may be disposed between the redistribution overlapping portion 409 and the top conductive layer 305. The programmable insulating layer 303 may electrically insulate or isolate the redistribution overlapping portion 409 and the top conductive layer 305 before programming the semiconductor device 1I.

The redistribution overlapping portion 409, the programmable insulating layer 303, and the top conductive layer 305 together form a programmable unit 30. The redistribution contact portion 413, the redistribution connection portion 411, and the programmable unit 30 together configure a programmable feature such as an anti-fuse.

During programming of the semiconductor device 1I, a programming voltage may be provided and applied to the semiconductor device 1I through the redistribution contact portion 413 and the top conductive layer 305. By applying enough programming voltage, electrical fields induced by the programming voltage may make the programmable insulating layer 303 broken down to form a rupture point of the programmable insulating layer 303. Accordingly, a resistance reduction of the programmable unit 30 may be induced and an electrically conductive path may be permanently created.

Figure 10:
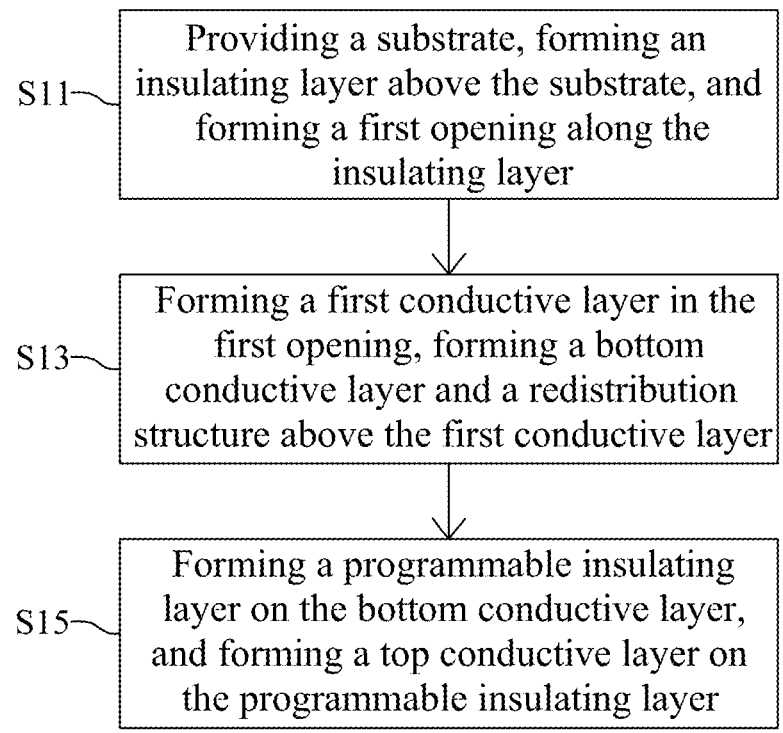
FIG. 10 illustrates, in a flowchart diagram form, a method for fabricating a semiconductor device in accordance with one embodiment of the present disclosure.

FIG. 10 illustrates, in a flowchart diagram form, a method 10 for fabricating a semiconductor device 1A in accordance with one embodiment of the present disclosure. FIGS. 11 to 15 illustrate, in schematic cross-sectional view diagrams, a flow for fabricating the semiconductor device 1A in accordance with one embodiment of the present disclosure.

Figure 11:
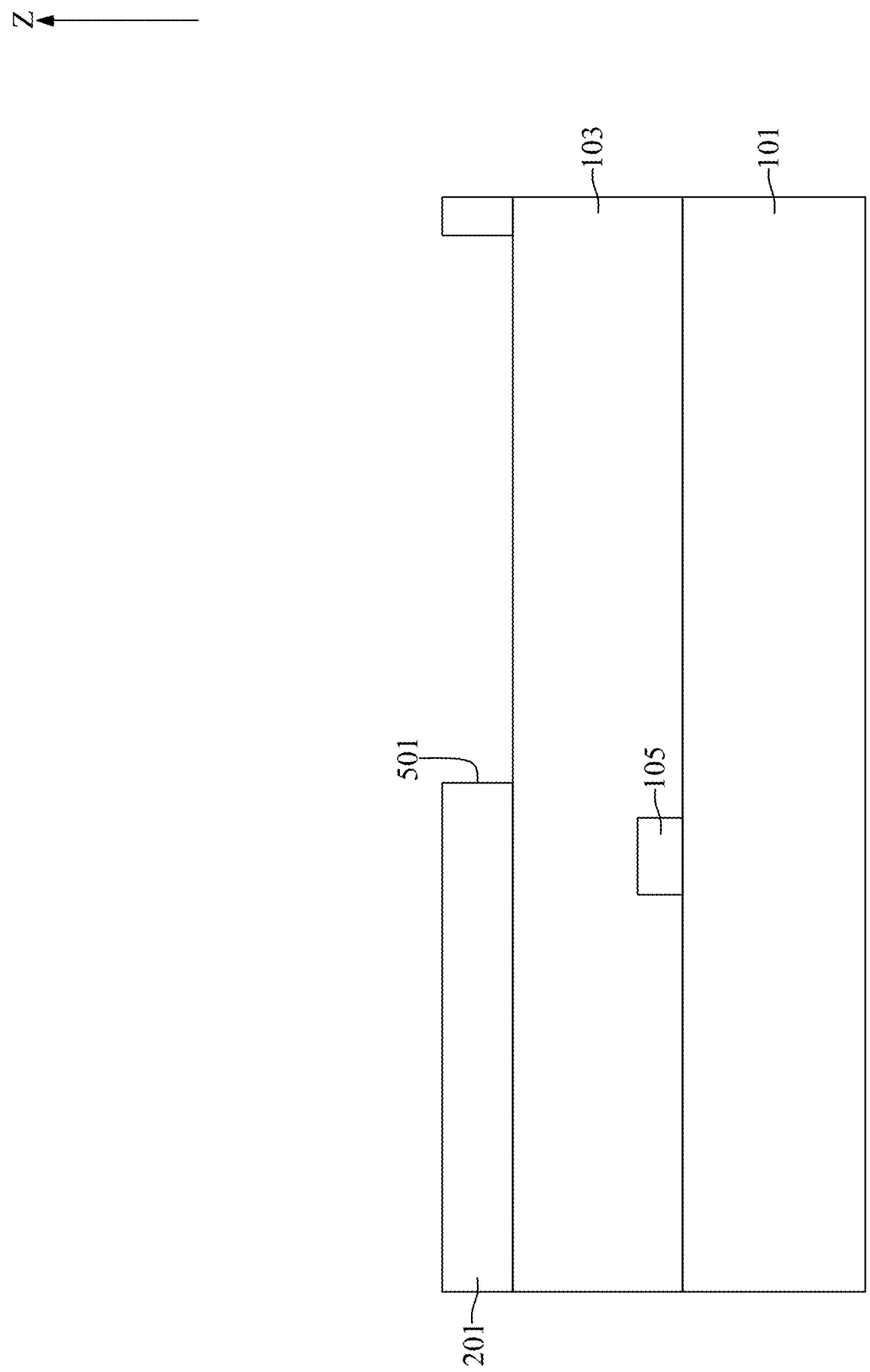
FIGS. 11 to 15 illustrate, in schematic cross-sectional view diagrams, a flow for fabricating the semiconductor device in accordance with one embodiment of the present disclosure.

With reference to FIGS. 10 and 11, at step S11, a substrate 101 may be provided, an insulating layer 201 may be formed above the substrate 101, and a first opening 501 may be formed along the insulating layer 201.

With reference to FIG. 11, an inter-layer structure 103 may be formed on the substrate 101. The inter-layer structure 103 may include dielectrics, insulating layers, and conductive features. Device elements 105 may be formed in the inter-layer structure 103 and electrically coupled to the conductive features of the inter-layer structure 103. The insulating layer 201 may be formed on the inter-layer structure 103. The first opening 501 may be formed along the insulating layer 201 by a photolithography process and a subsequently etch process.

In some embodiments, a cleaning process and a passivation process may be performed on the first opening 501. The cleaning process may remove oxide, originating from oxidation by oxygen in the air, from the top surface of the topmost conductive feature of the inter-layer structure 103 without damaging thereof. The cleaning process may include applying a mixture of hydrogen and argon as a remote plasma source onto the first opening 501. A process temperature of the cleaning process may be between about 250° C. and about 350° C. A process pressure of the cleaning process may be between about 1 Torr and about 10 Torr. A bias energy may be applied to the equipment performing the cleaning process. The bias energy may be between about 0 W and 200 W.

The passivation process may include soaking the intermediate semiconductor device with a precursor such as dimethylaminotrimethylsilane, tetramethylsilane, or the like at a process temperature between about 200° C. and about 400° C. An ultraviolet radiation may be used to facilitate the passivation process. The passivation process may passivate sidewalls of the insulating layer 201 exposed through the first opening 501 by sealing surface pores thereof. Undesirable sidewall growth, which may affect the electric characteristics of the semiconductor device 1A, may be reduced by the passivation process. As a result, the performance and reliability of the semiconductor device 1A may be increased.

Figure 12:
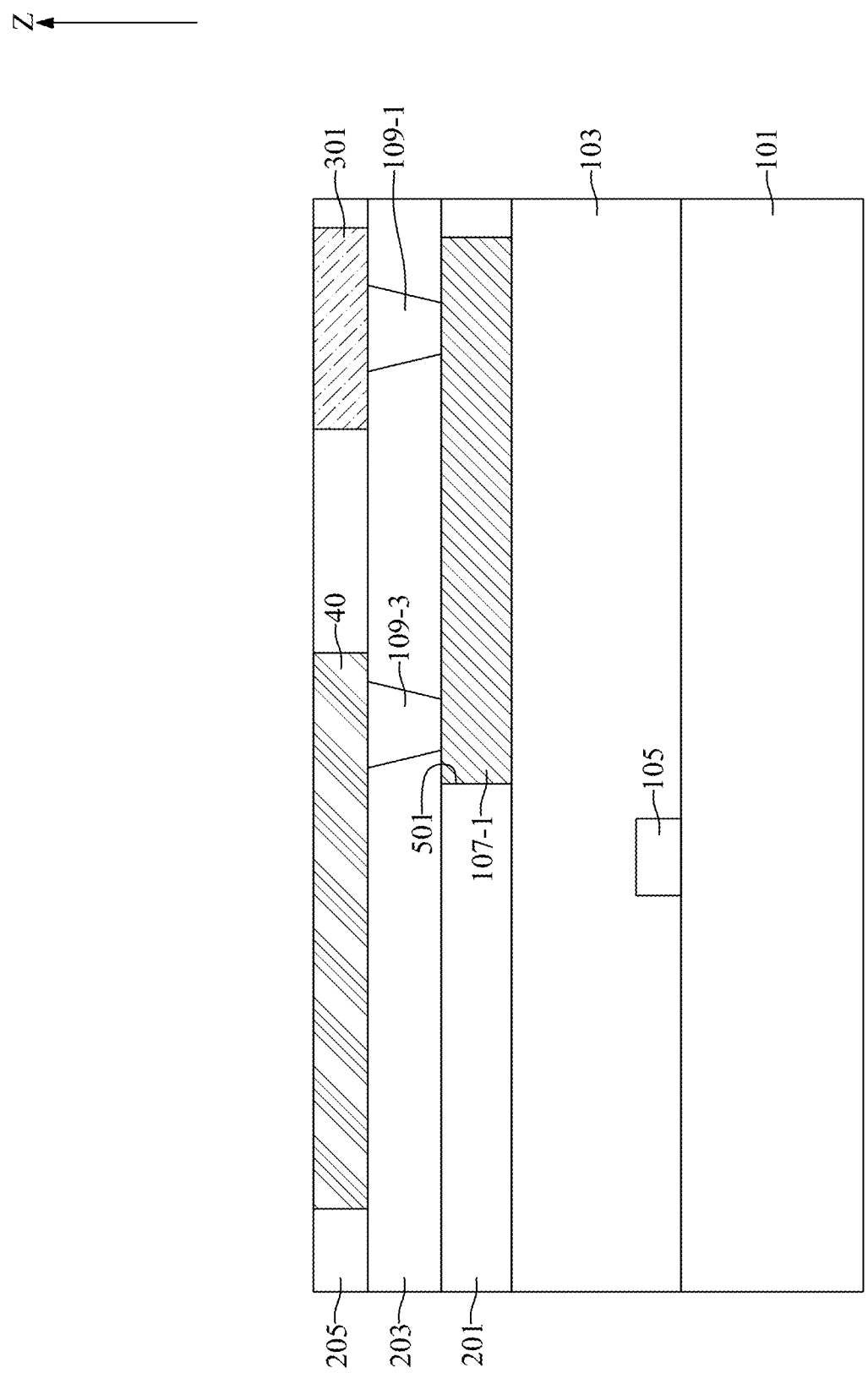

With reference to FIGS. 10 and 12, at step S13, a first conductive layer 107-1 may be formed in the first opening 501, a bottom conductive layer 301 and a redistribution structure 40 may be formed above the first conductive layer 107-1 and may be electrically coupled to the first conductive layer 107-1.

With reference to FIG. 12, insulating layer 203, 205 may be sequentially formed on the insulating layer 201. A first conductive via 109-1 and a second conductive via 109-3 may be formed in the insulating layer 203 and may be respectively correspondingly electrically connected the first conductive layer 107-1. The bottom conductive layer 301 may be formed on the first conductive via 109-1 and in the insulating layer 205. The redistribution structure 40 may be formed on the second conductive via 109-3 and in the insulating layer 205. In some embodiments, the first and the second conductive via 109-1, 109-3, the bottom conductive layer 301, and the redistribution structure 40 may be formed separately. In some embodiments, the first and the second conductive via 109-1, 109-3, the bottom conductive layer 301, and the redistribution structure 40 may be formed concurrently. For example, the first and the second conductive via 109-1, 109-3, the bottom conductive layer 301, and the redistribution structure 40 may be formed by a dual damascene process. The top surfaces of the bottom conductive layer 301 and the redistribution structure 40 may be substantially coplanar. In other words, the redistribution structure 40 and the bottom conductive layer 301 may be at a same vertical level.

With reference to FIG. 10 and FIGS. 13 to 15, at step S15, a programmable insulating layer 303 may be formed on the bottom conductive layer 301, and a top conductive layer 305 may be formed on the programmable insulating layer 303.

Figure 13:
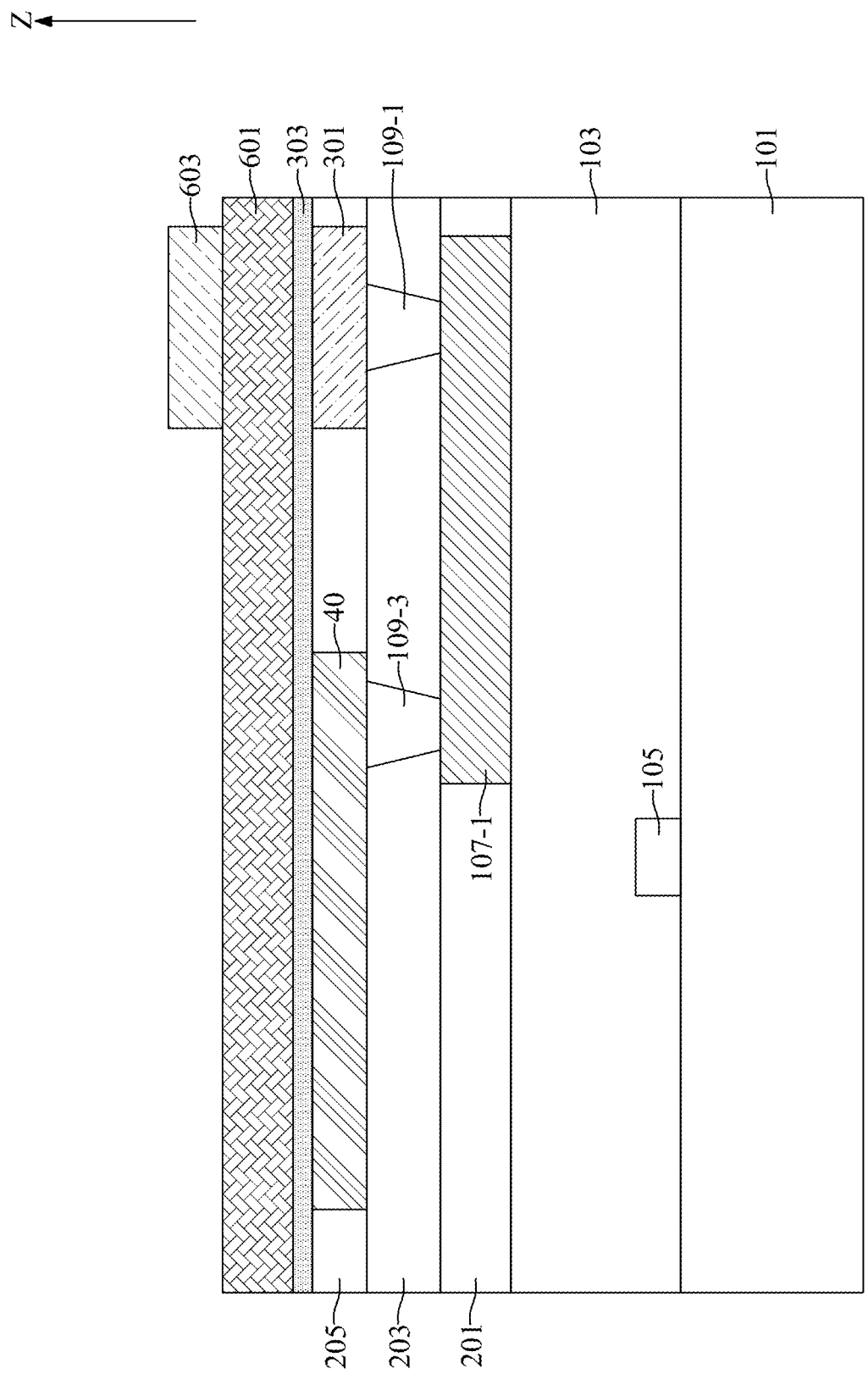

With reference to FIG. 13, the programmable insulating layer 303 may be formed on the insulating layer 205 and to cover the bottom conductive layer 301 and the redistribution structure 40. A layer of first conductive material 601 may be formed on the programmable insulating layer 303. The first conductive material 601 may be, for example, silicon, germanium, doped silicon, doped silicon germanium, tungsten, cobalt, zirconium, tantalum, titanium, aluminum, ruthenium, copper, metal carbides, metal nitrides, transition metal aluminides, or combinations thereof. A first mask layer 603 may be formed on the layer of first conductive material 601. The first mask layer 603 may be a photoresist layer or a hard mask layer. The first mask layer 603 may have a pattern of a programmable unit 30 and may be vertically overlapped with the bottom conductive layer 301.

Figure 14:
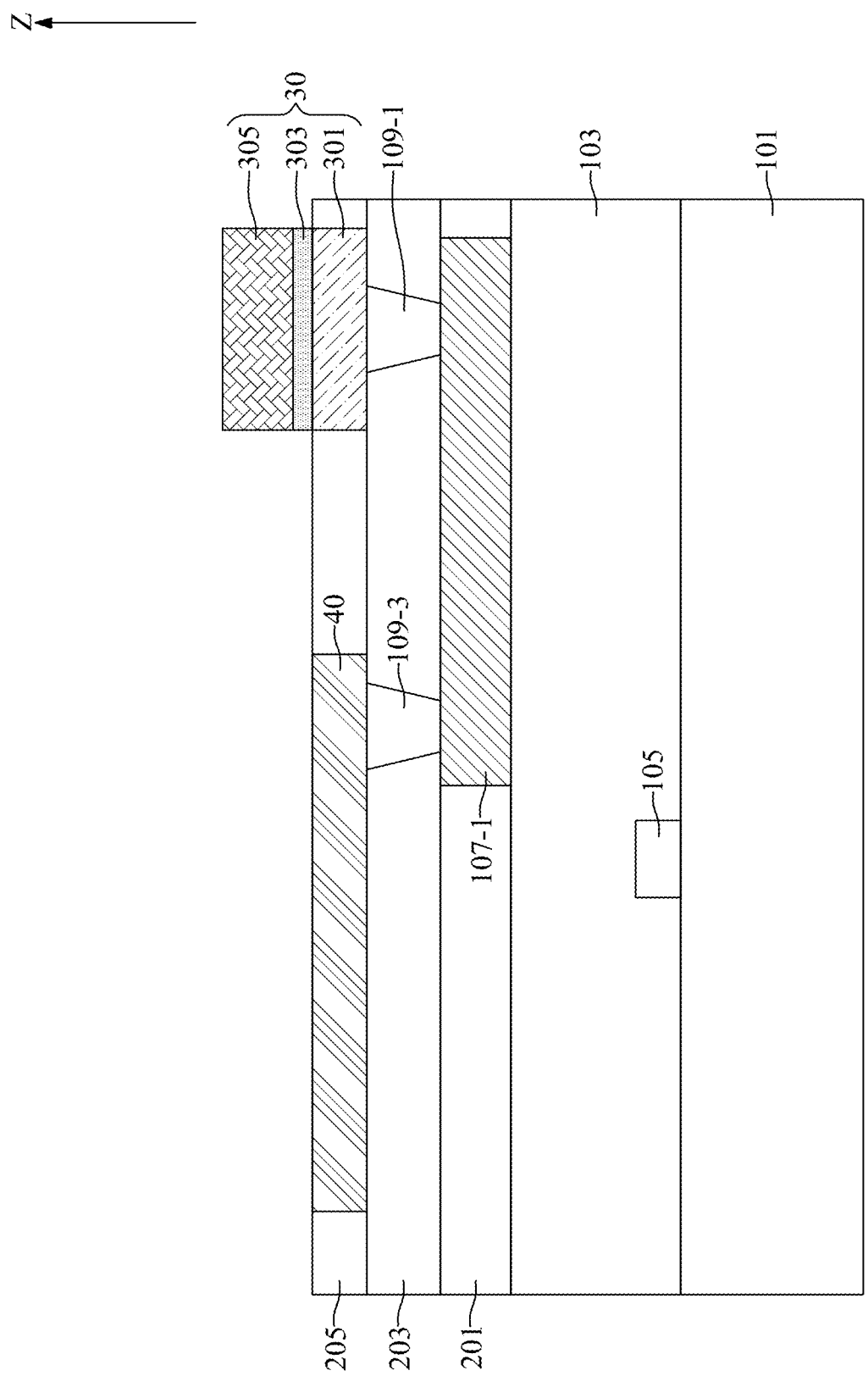

With reference to FIG. 14, an etch process, such as an anisotropic dry etch process, may be performed to remove a portion of the layer of first conductive material 601 and the programmable insulating layer 303. After the etch process, the layer of first conductive material 601 may be turned into the top conductive layer 305 and the programmable insulating layer 303 may be trimmed. The bottom conductive layer 301, the programmable insulating layer 303, and the top conductive layer 305 together configure the programmable unit 30.

Figure 15:
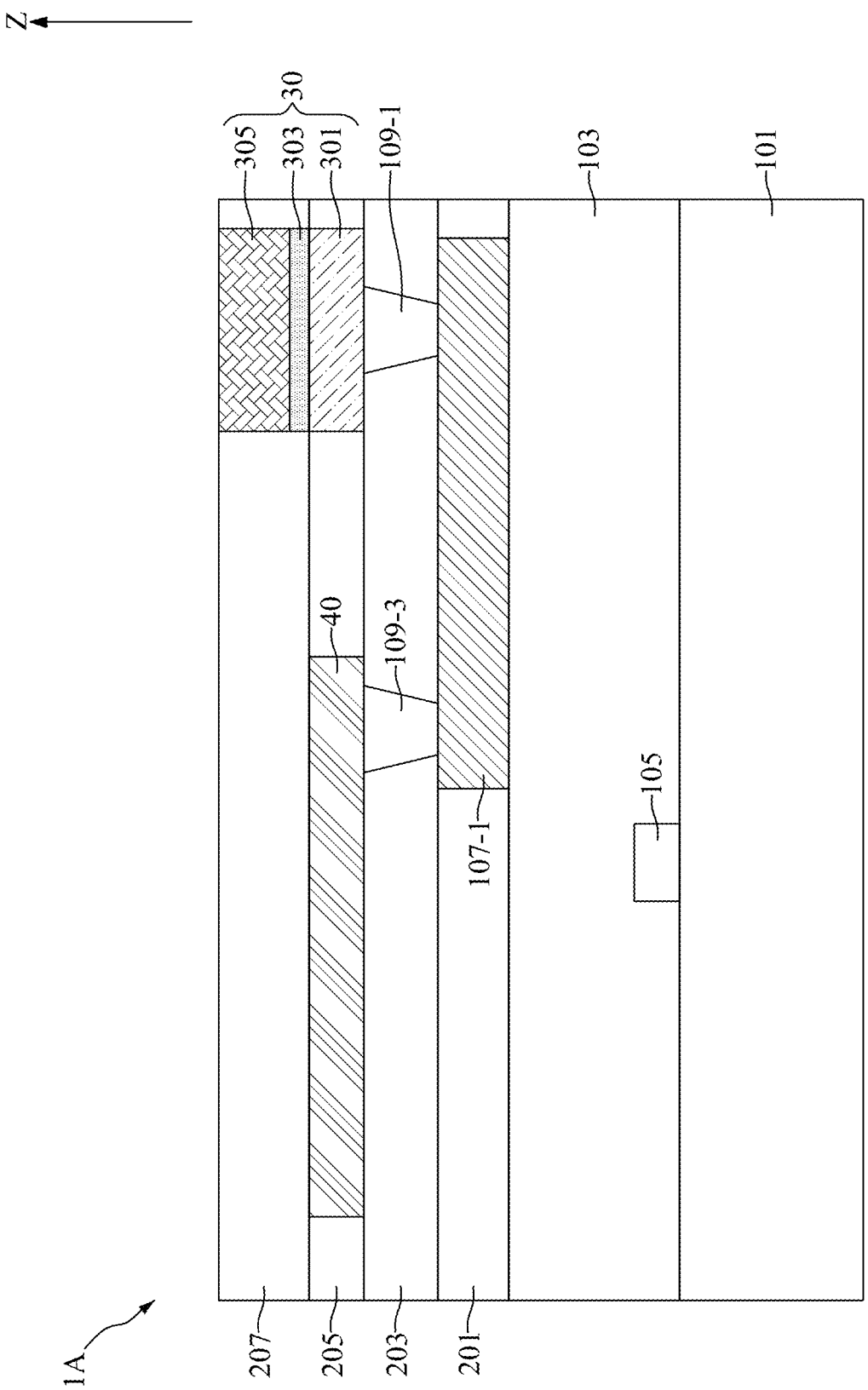

With reference to FIG. 15, an insulating layer 207 may be formed on the insulating layer 205 to cover the redistribution structure 40 and the top conductive layer 305. A planarization process, such as chemical mechanical polishing, may be performed to provide a substantially flat surface for subsequent processing steps.

Figure 16:
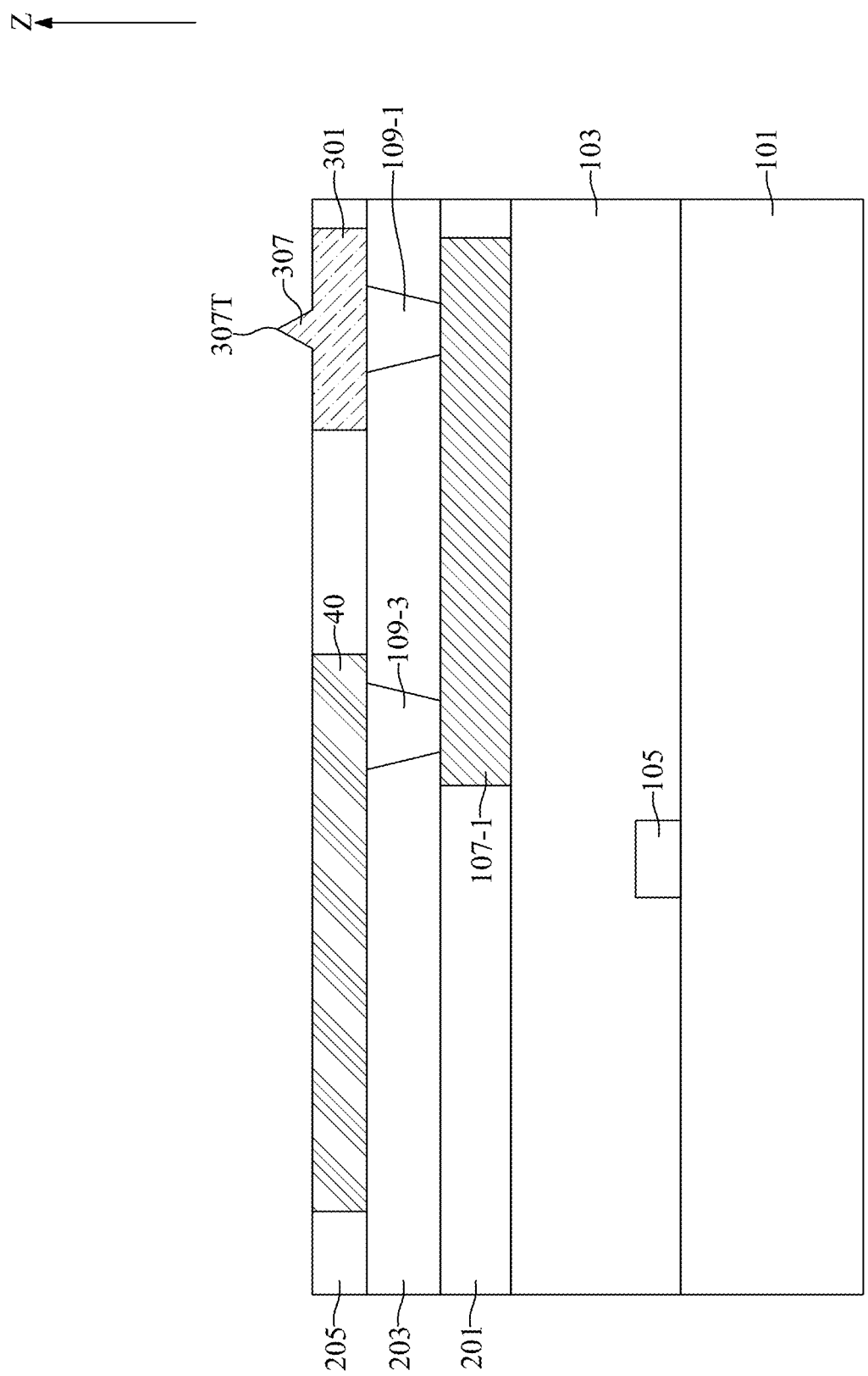
FIGS. 16 to 18 illustrate, in schematic cross-sectional view diagrams, a flow for fabricating the semiconductor device in accordance with another embodiment of the present disclosure.
Figure 17:
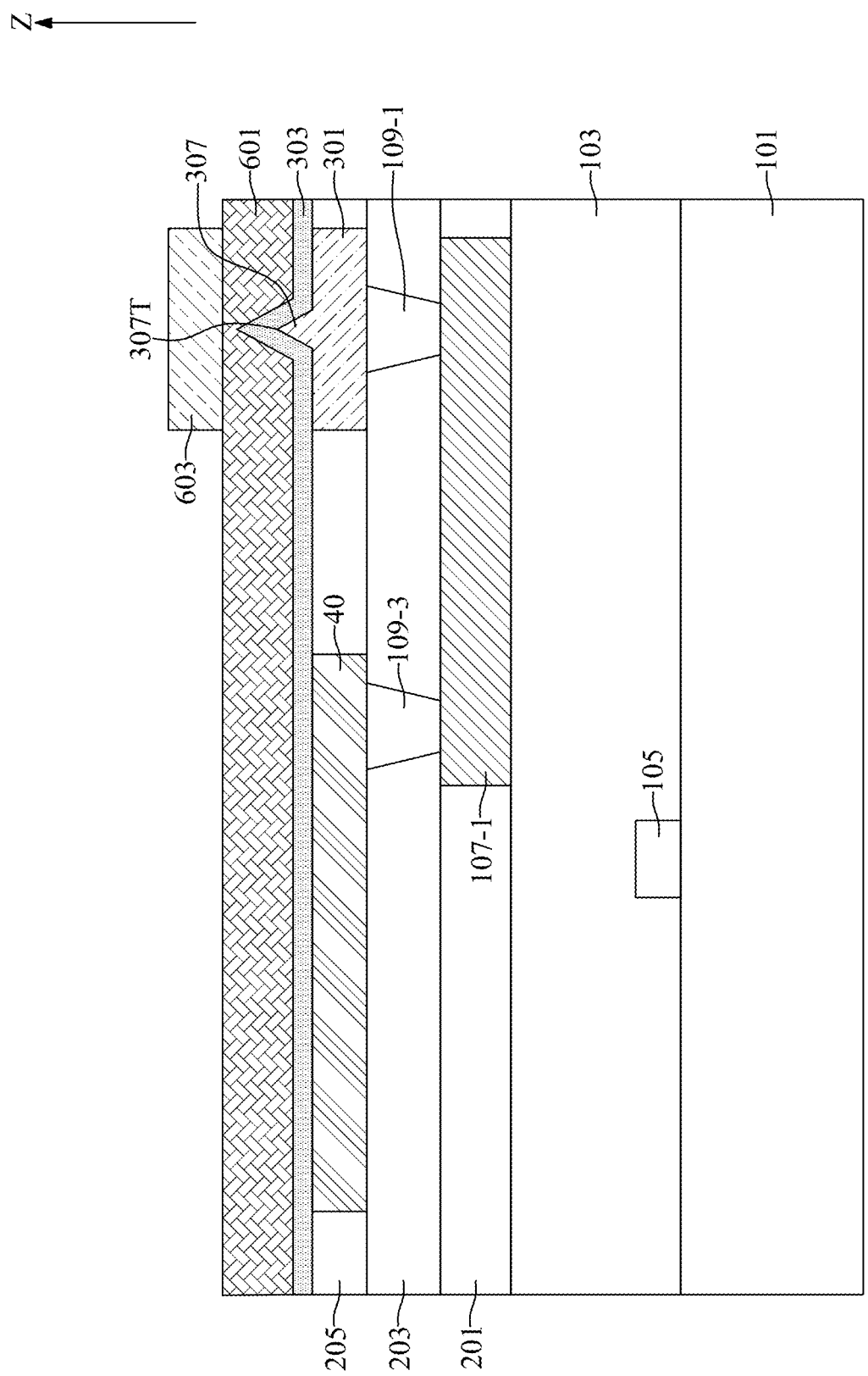
Figure 18:
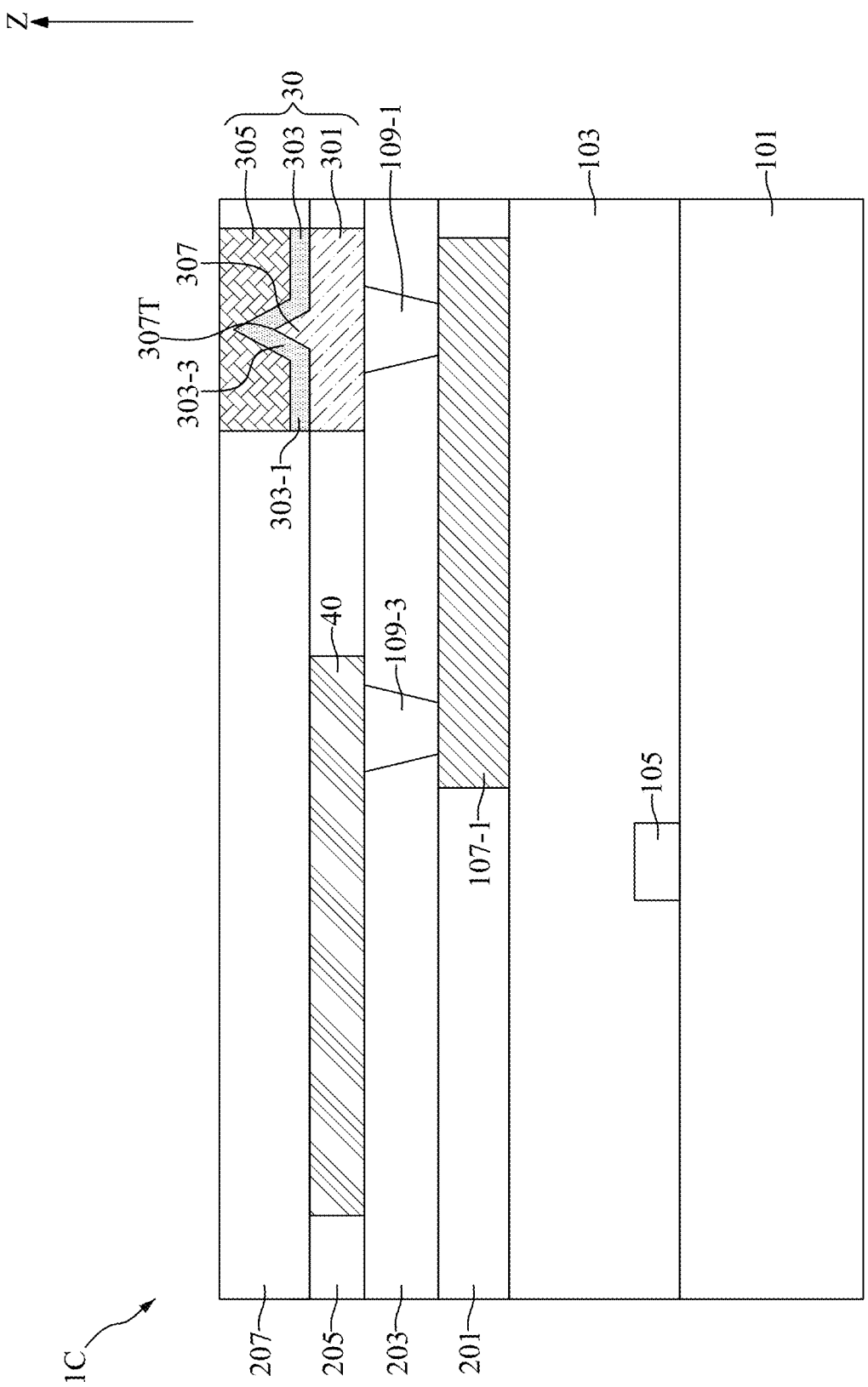

FIGS. 16 to 18 illustrate, in schematic cross-sectional view diagrams, a flow for fabricating the semiconductor device 1C in accordance with another embodiment of the present disclosure.

With reference to FIG. 16, an intermediate semiconductor device may be fabricated with a procedure similar to that illustrated in FIGS. 11 and 12. A peak portion 307 may be formed on the bottom conductive layer 301 by, for example, an epitaxial growth process.

With reference to FIG. 17, the programmable insulating layer 303, the layer of first conductive material 601, and the first mask layer 603 may be formed with a procedure similar to that illustrated in FIG. 13. A planarization process, such as chemical mechanical polishing, may be performed to provide a substantially flat surface for subsequent processing steps.

With reference to FIG. 18, the programmable unit 30 and the insulating layer 207 may be formed with a procedure similar to that illustrated in FIGS. 14 and 15.

Figure 19:
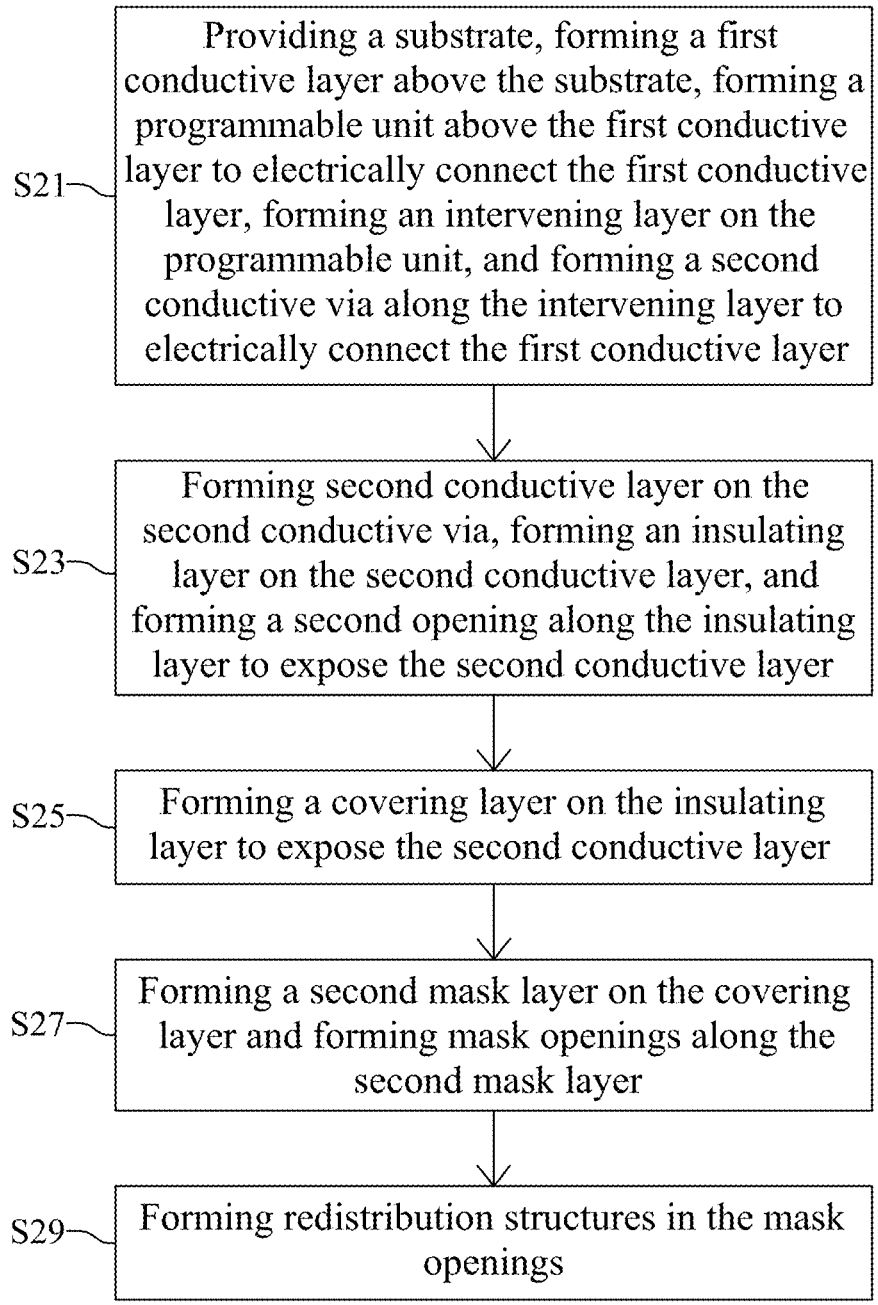
FIG. 19 illustrates, in a flowchart diagram form, a method for fabricating a semiconductor device in accordance with another embodiment of the present disclosure.
Figure 20:
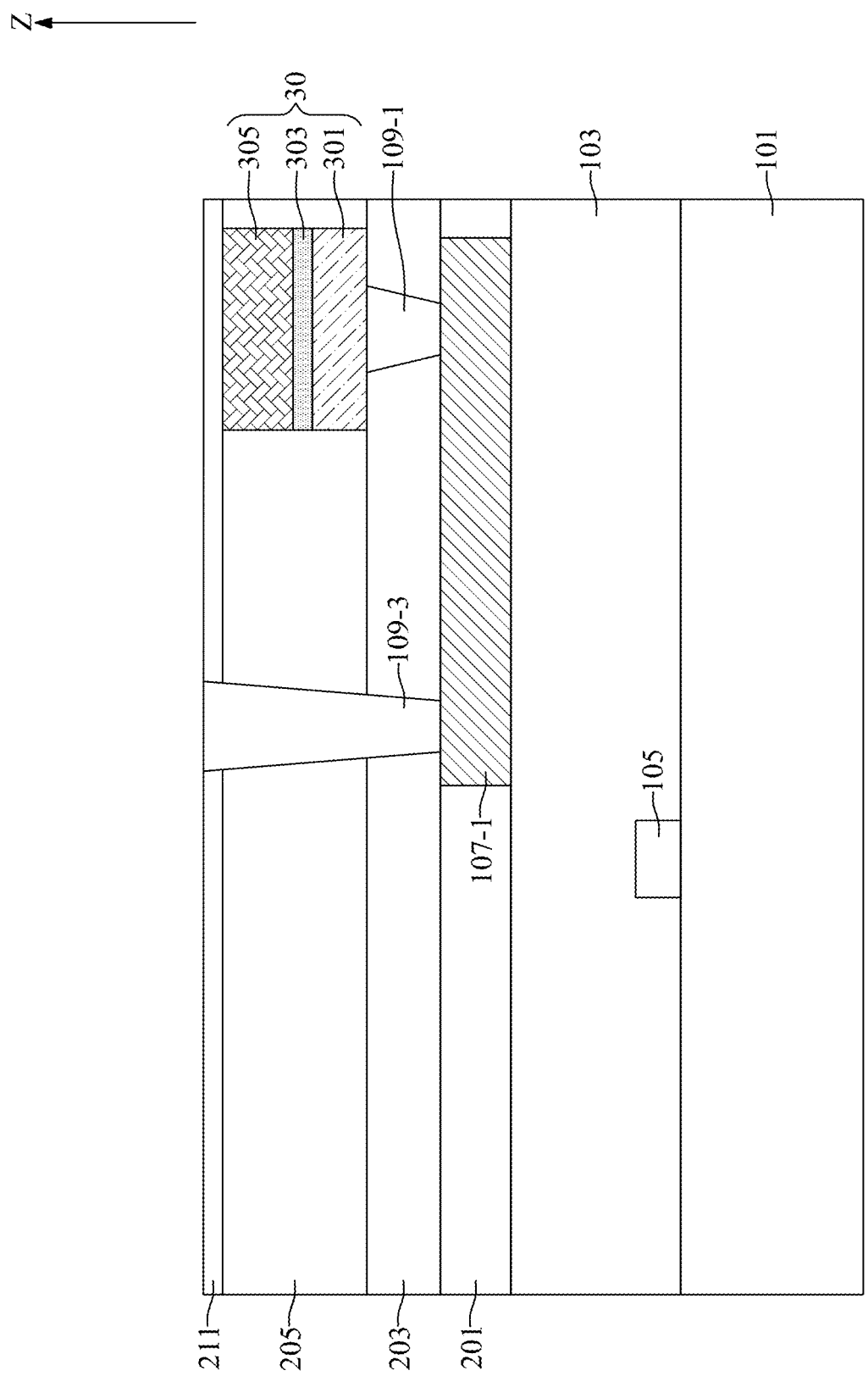
FIG. 20 illustrates, in a schematic cross-sectional view diagram, prat of a flow for fabricating the semiconductor device in accordance with another embodiment of the present disclosure.

FIG. 19 illustrates, in a flowchart diagram form, a method 20 for fabricating a semiconductor device 1G in accordance with another embodiment of the present disclosure. FIG. 20 illustrates, in a schematic cross-sectional view diagram, prat of a flow for fabricating the semiconductor device 1G in accordance with another embodiment of the present disclosure.

With reference to FIGS. 19 and 20, at step S21, a substrate 101 may be provided, a first conductive layer 107-1 may be formed above the substrate 101, a programmable unit 30 may be formed above the first conductive layer 107-1 and may be electrically connected to the first conductive layer 107-1 through a first conductive via 109-1, an intervening layer 211 may be formed on the programmable unit 30, and a second conductive via 109-3 may be formed along the intervening layer 211 to electrically connect the first conductive layer 107-1.

With reference to FIG. 20, the substrate 101, the interlayer structure 103, the device elements 105, the first conductive layer 107-1, and the insulating layer 201 may be formed with a procedure similar to that illustrated in FIGS. 11 and 12. An insulating layer 203 may be formed on the insulating layer 201. The first conductive via 109-1 may be formed along the insulating layer 203 to electrically connect to the first conductive layer 107-1. The programmable unit 30 may be formed on the first conductive via 109-1. The programmable unit 30 may include a bottom conductive layer 301, a programmable insulating layer 303, and a top conductive layer 305. The programmable unit 30 may be formed with a procedure similar to that illustrated in FIGS. 13 and 14.

With reference to FIG. 20, an insulating layer 205 may be formed on the insulating layer 203 and to cover the programmable unit 30. A planarization process, such as chemical mechanical polishing, may be performed until the top surface of the top conductive layer 305 is exposed to provide a substantially flat surface for subsequent processing steps. The intervening layer 211 may be formed on the insulating layer 205 and the programmable unit 30. The second conductive via 109-3 may be formed along the intervening layer 211, the insulating layer 205, and the insulating layer 203 to electrically connect the first conductive layer 107-1.

Figure 21:
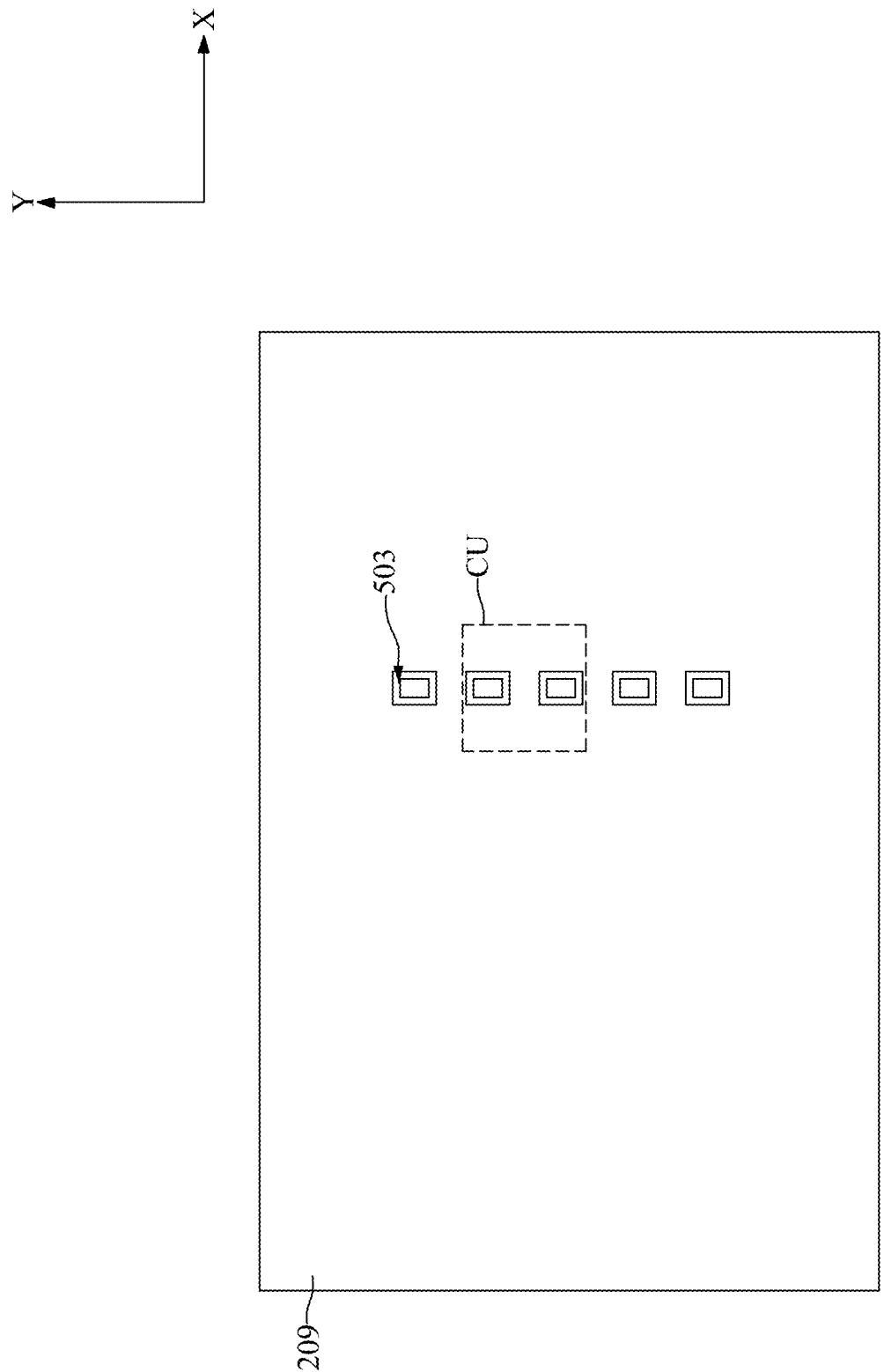
FIG. 21 illustrates, in a schematic top-view diagram, an intermediate semiconductor device in accordance with another embodiment of the present disclosure.
Figure 22:
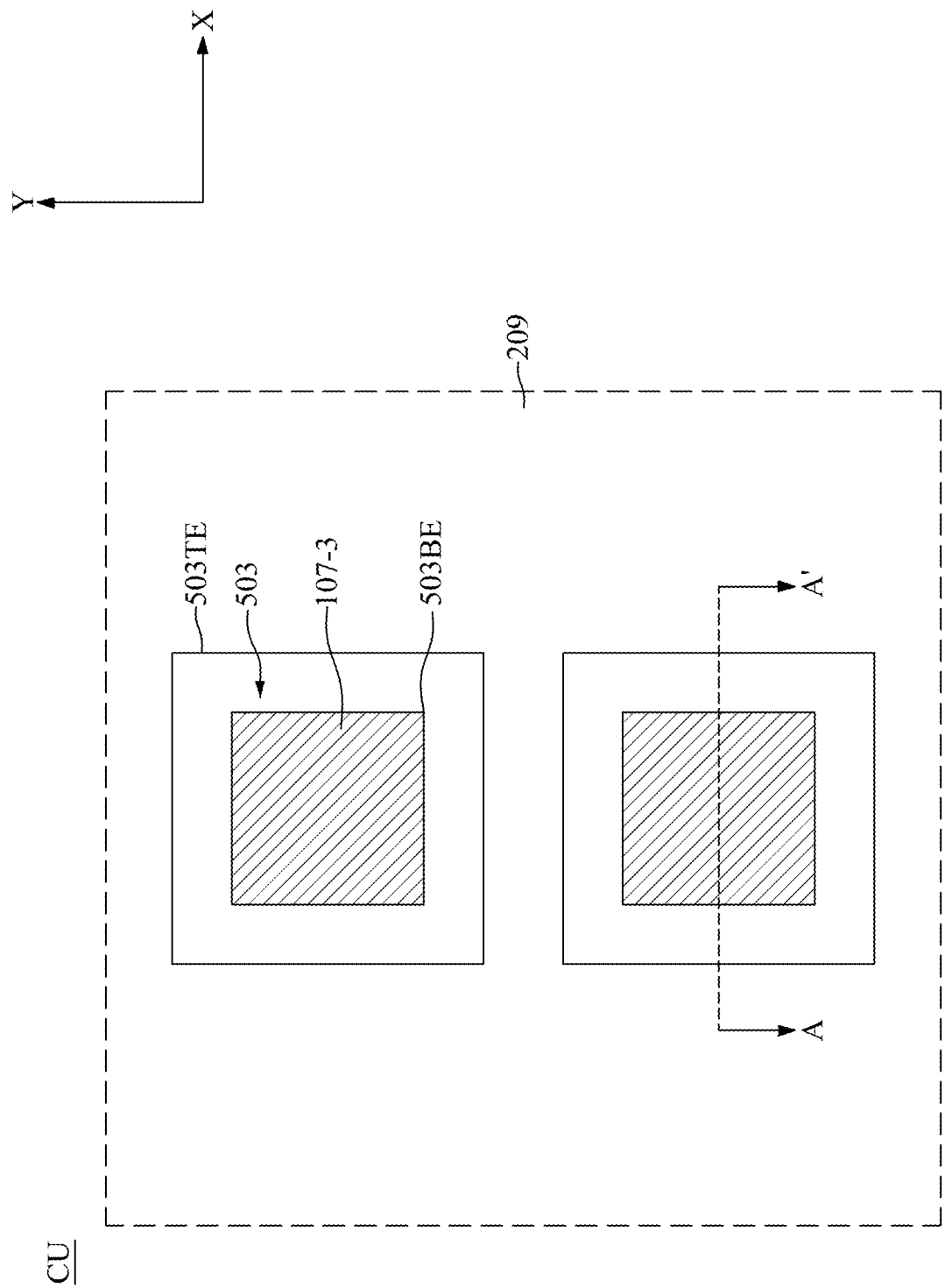
FIG. 22 illustrates, in a schematic close-up top-view diagram, an intermediate semiconductor device of the CU area in FIG. 21.
Figure 23:
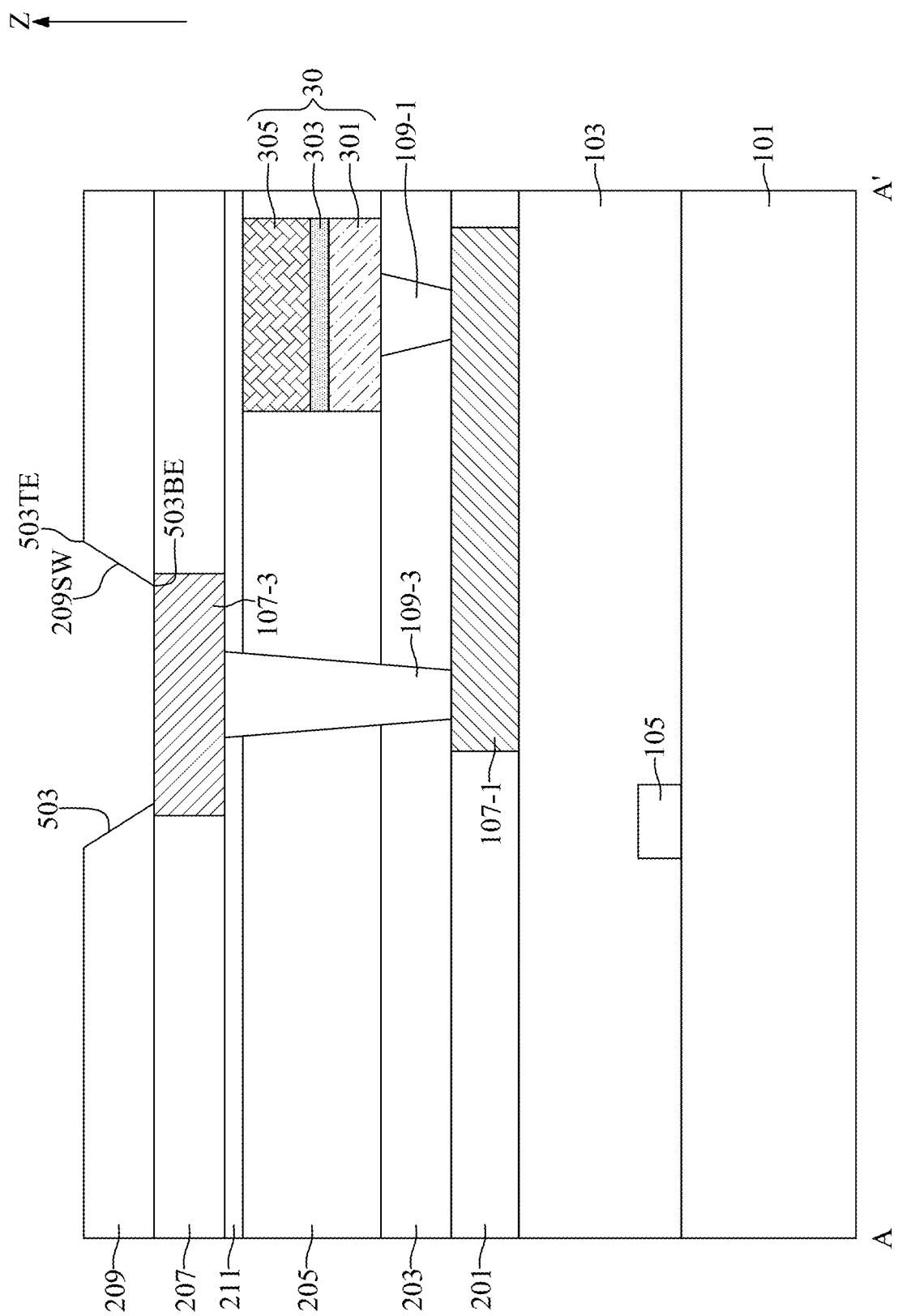
FIG. 23 is a schematic cross-sectional view diagram taken along the line A-A' in FIG. 22.

FIG. 21 illustrates, in a schematic top-view diagram, an intermediate semiconductor device in accordance with another embodiment of the present disclosure. FIG. 22 illustrates, in a schematic close-up top-view diagram, an intermediate semiconductor device of the CU area in FIG. 21 in accordance with another embodiment of the present disclosure. FIG. 23 is a schematic cross-sectional view diagram taken along the line A-A' in FIG. 22.

With reference to FIG. 19 and FIGS. 21 to 23, at step S23, a second conductive layer 107-3 may be formed on the second conductive via 109-3, an insulating layer 209 may be formed on the second conductive layer 107-3, and a second opening 503 may be formed along the insulating layer 209 to expose the second conductive layer 107-3.

With reference to FIGS. 21 to 23, an insulating layer 207 may be formed on the intervening layer 211. The second conductive layer 107-3 may be formed on the second conductive via 109-3 and in the insulating layer 207. The insulating layer 207 and the second conductive layer 107-3 may be formed with a procedure similar to the insulating layer 201 and the first conductive layer 107-1.

With reference to FIGS. 21 to 23, the insulating layer 209 may be formed on the insulating layer 207 and the second conductive layer 107-3. The second opening 503 may be formed along the insulating layer 209 by a photolithography process and a subsequently etch process. A portion of the top surface of the second conductive layer 107-3 may be exposed through the second opening 503. In some embodiments, the second opening 503 may include tapered sidewalls 209SW. In some embodiments, the tapered sidewall 209SW may extend from the bottom edge 503BE of the second opening 503 to the top edge 503TE of the second opening 503 in a cross-sectional perspective. The bottom edge 503BE of the bottom edge 503BE may have a rectangular shape, and the top edge 503TE of the second opening 503 may also have a rectangular shape in a top-view perspective. The bottom edge 503BE of the bottom edge 503BE may define an exposed region of the top surface of the second conductive layer 107-3.

Figure 24:
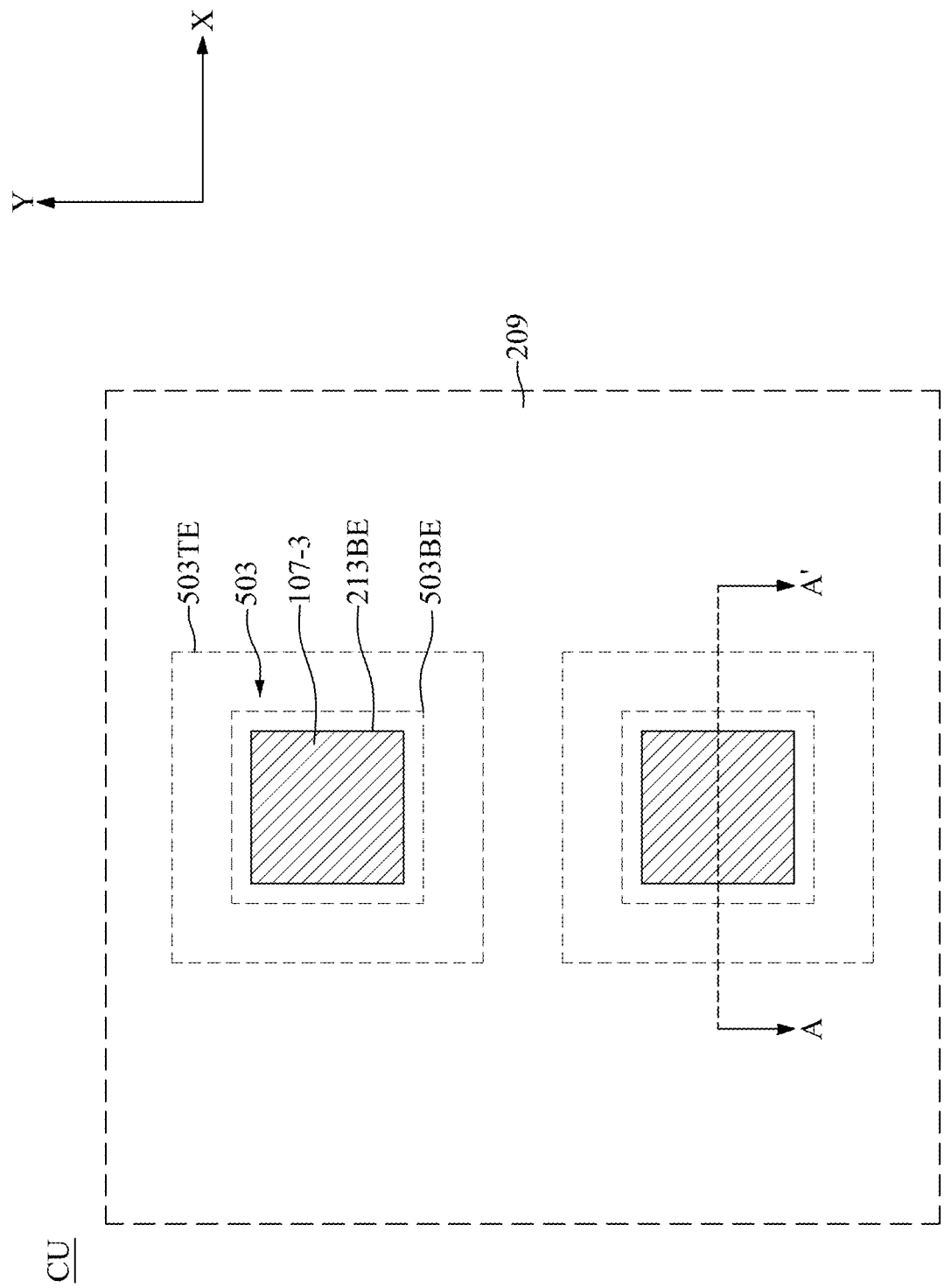
FIG. 24 illustrates, in a schematic close-up top-view diagram, an intermediate semiconductor device of the CU area in FIG. 21.
Figure 25:
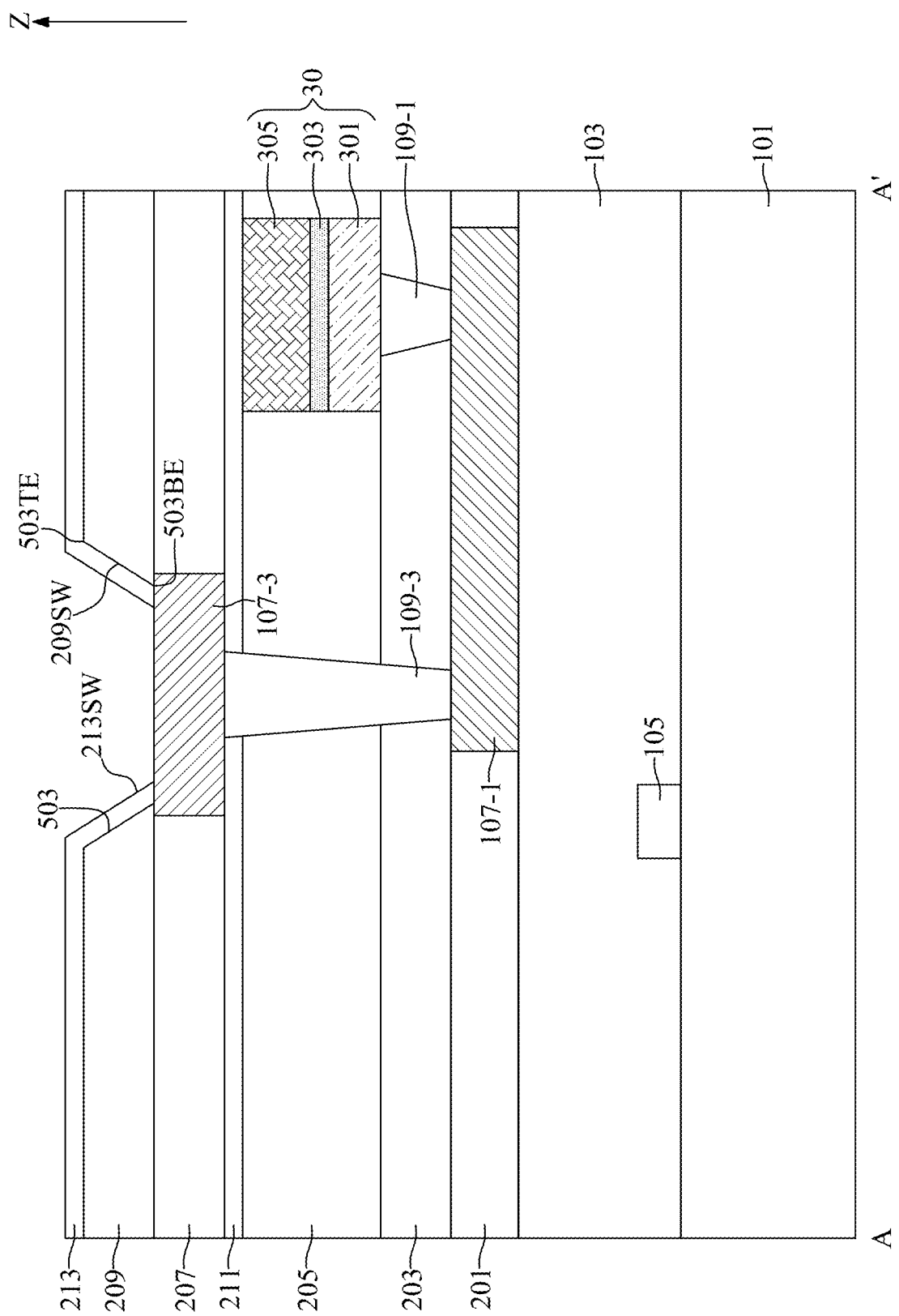
FIG. 25 is a schematic cross-sectional view diagram taken along the line A-A' in FIG. 24.

FIG. 24 illustrates, in a schematic close-up top-view diagram, an intermediate semiconductor device of the CU area in FIG. 21 in accordance with another embodiment of the present disclosure. FIG. 25 is a schematic cross-sectional view diagram taken along the line A-A' in FIG. 24.

With reference to FIGS. 19, 24, and 25, at step S25, a covering layer 213 may be formed on the insulating layer 209 to expose the second conductive layer 107-3.

With reference to FIGS. 24 and 25, the covering layer 213 may be conformally formed on the insulating layer 209 to reveal the exposed top surface of the second conductive layer 107-3. The covering layer 213 may conformally cover the tapered sidewalls 209SW of the second opening 503 to form corresponding tapered sidewalls 213SW. The bottom edge 213BE of the covering layer 213 may extend to cover the bottom edge 503BE of the second opening 503 and to contact the edge of the exposed top surface of the second conductive layer 107-3.

Figure 26:
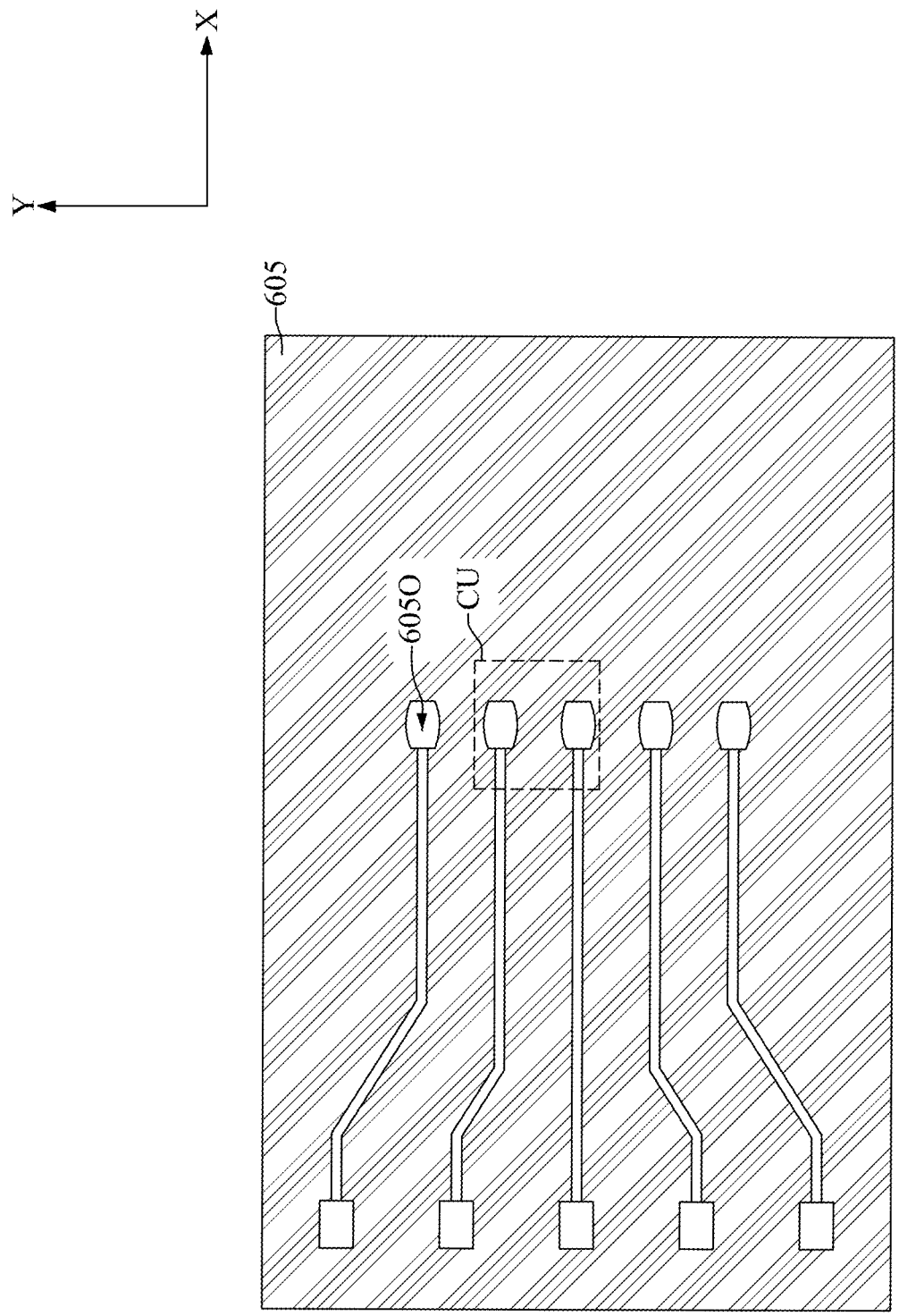
FIG. 26 illustrates, in a schematic top-view diagram, an intermediate semiconductor device in accordance with another embodiment of the present disclosure.
Figure 27:
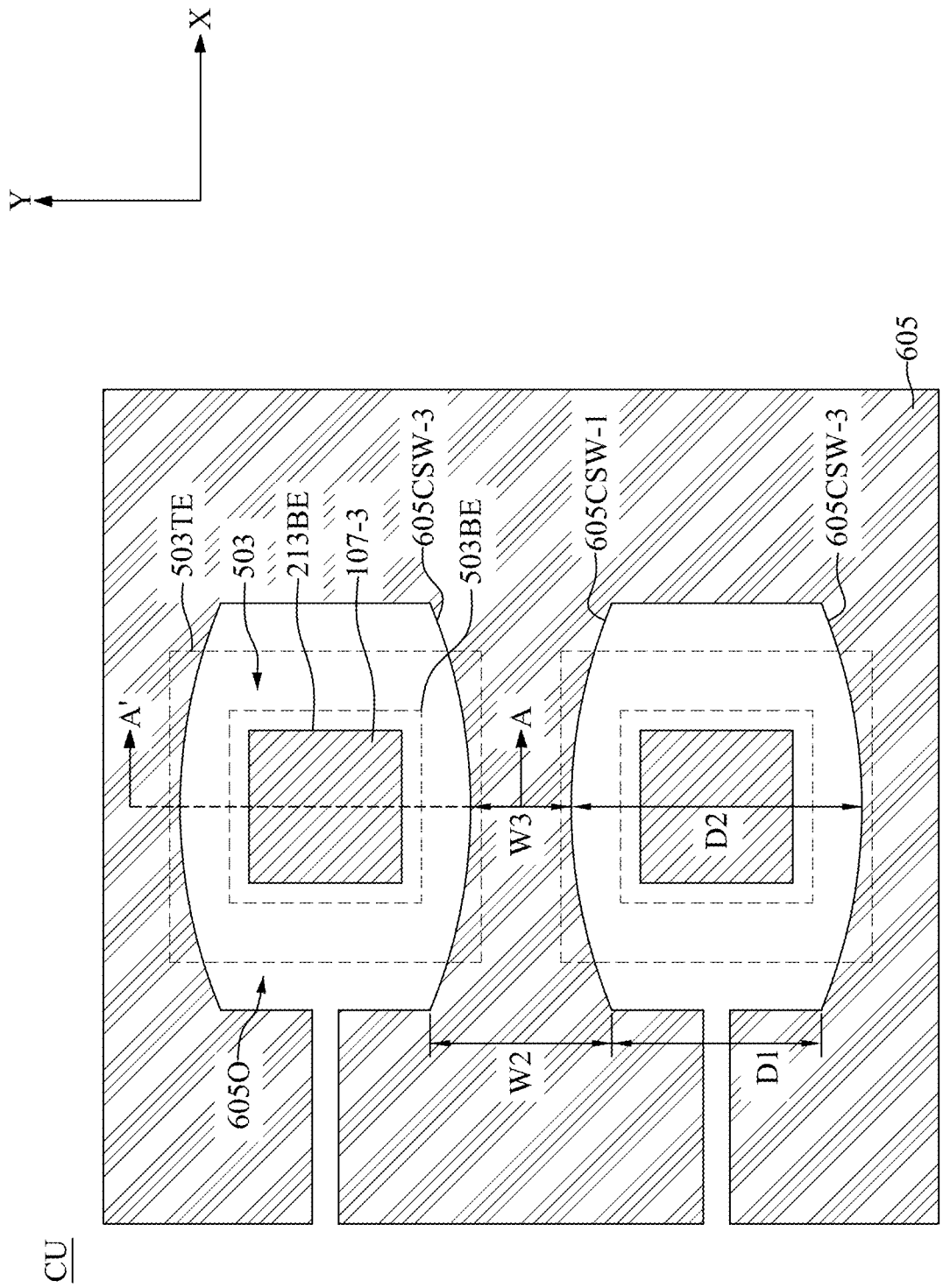
FIG. 27 illustrates, in a schematic close-up top-view diagram, an intermediate semiconductor device of the CU area in FIG. 26.
Figure 28:
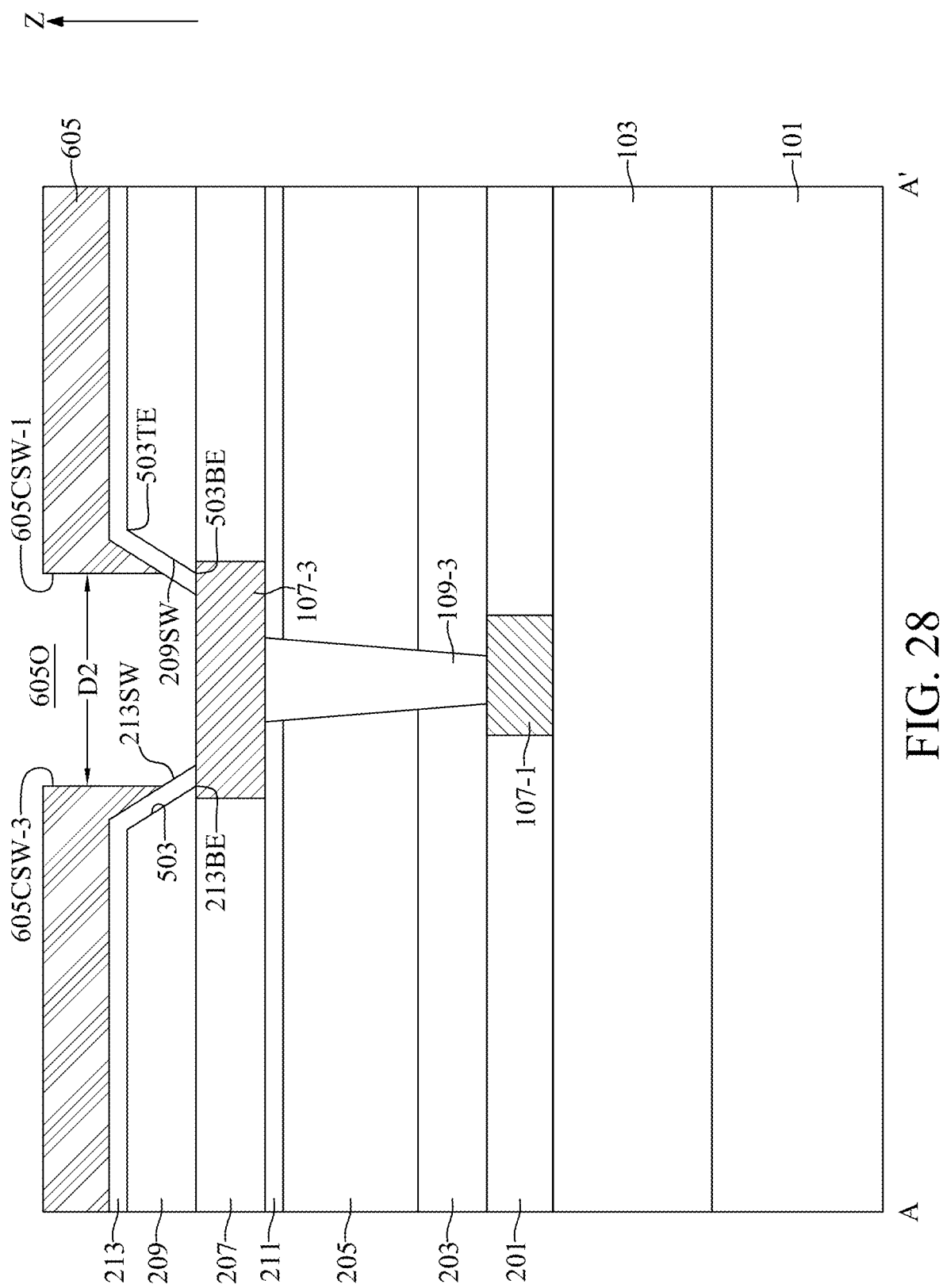
FIG. 28 is a schematic cross-sectional view diagram taken along the line A-A' in FIG. 27.

FIG. 26 illustrates, in a schematic top-view diagram, an intermediate semiconductor device in accordance with another embodiment of the present disclosure. FIG. 27 illustrates, in a schematic close-up top-view diagram, an intermediate semiconductor device of the CU area in FIG. 26 in accordance with another embodiment of the present disclosure. FIG. 28 is a schematic cross-sectional view diagram taken along the line A-A' in FIG. 27.

With reference to FIG. 19 and FIGS. 26 to 28, at step S27, a second mask layer 605 may be formed on the covering layer 213 and mask openings 605O may be formed along the second mask layer 605.

With reference to FIGS. 26 to 28, the second mask layer 605 may be a photoresist layer. The mask openings 605O may define the pattern of redistribution structures 40. In a top-view perspective, the mask opening 605O may be spaced apart from each other and may be arranged along a direction Y. For convenience of description, only one mask opening 605O is described.

With reference to FIGS. 26 and 27, in a top-view perspective, the mask opening 605O may include an upper curved sidewall 605CSW-1 and a lower curved sidewall 605CSW-3 which are arranged horizontally. The upper curved sidewall 605CSW-1 may have a convex shape. The lower curved sidewall 605CSW-3 may have a concave shape. The vertical distances parallel to the direction Y between the upper curved sidewall 605CSW-1 and the lower curved sidewall 605CSW-3 may vary between a relatively narrow distance D1 to a relatively wide distance D2 along a direction X perpendicular to the direction Y. Accordingly, the widths parallel to the direction Y between the upper curved sidewall 605CSW-1 of the mask opening 605O and the lower curved sidewall 605CSW-3 of an adjacent one of the mask opening 605O may vary between a relatively wider width W2 to a relatively narrow width W3 along the direction X.

The portion of the second mask layer 605 having wider width W2 may provide additional structural support to against collapse or deformation. In contrast, the portion of the second mask layer 605 having wider narrow width W3 may have relative low resistance against collapse or deformation. That is, the portion of the second mask layer 605 having wider narrow width W3 may be relatively fragile. However, the aforementioned structural support may compensate the relatively fragile portion of the second mask layer 605, the collapse or the deformation of the second mask layer 605 may be suppressed or reduced. That is, the second mask layer 605 and the mask opening 605O may be structural stable even some portions of the mask opening 605O are locate on the tapered sidewalls 213SW of the covering layer 213 as in FIG. 28. As a result, the redistribution structure 40, which will be fabricated later, may have a larger planar area which indicating less surface resistivity and better electrical transmitting performance.

Figure 29:
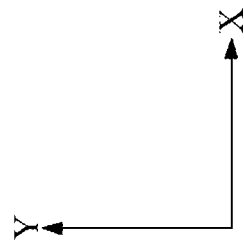
FIG. 29 illustrates, in a schematic top-view diagram, an intermediate semiconductor device in accordance with another embodiment of the present disclosure.
Figure 29:
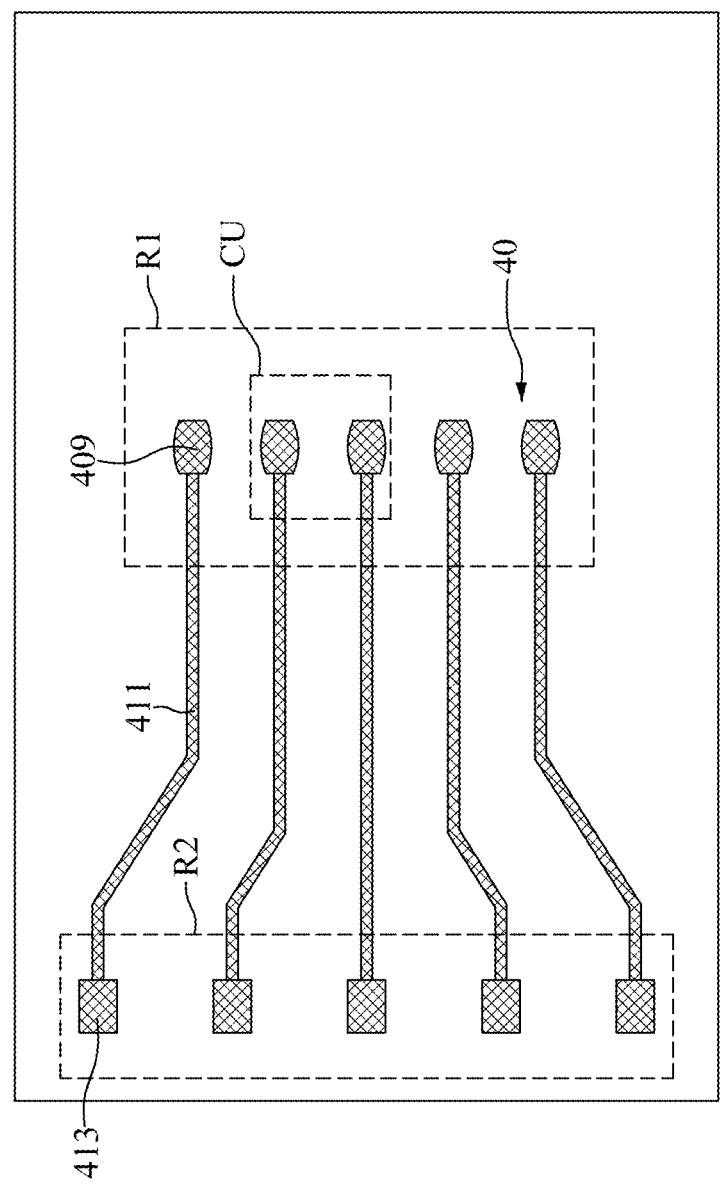
Figure 30:
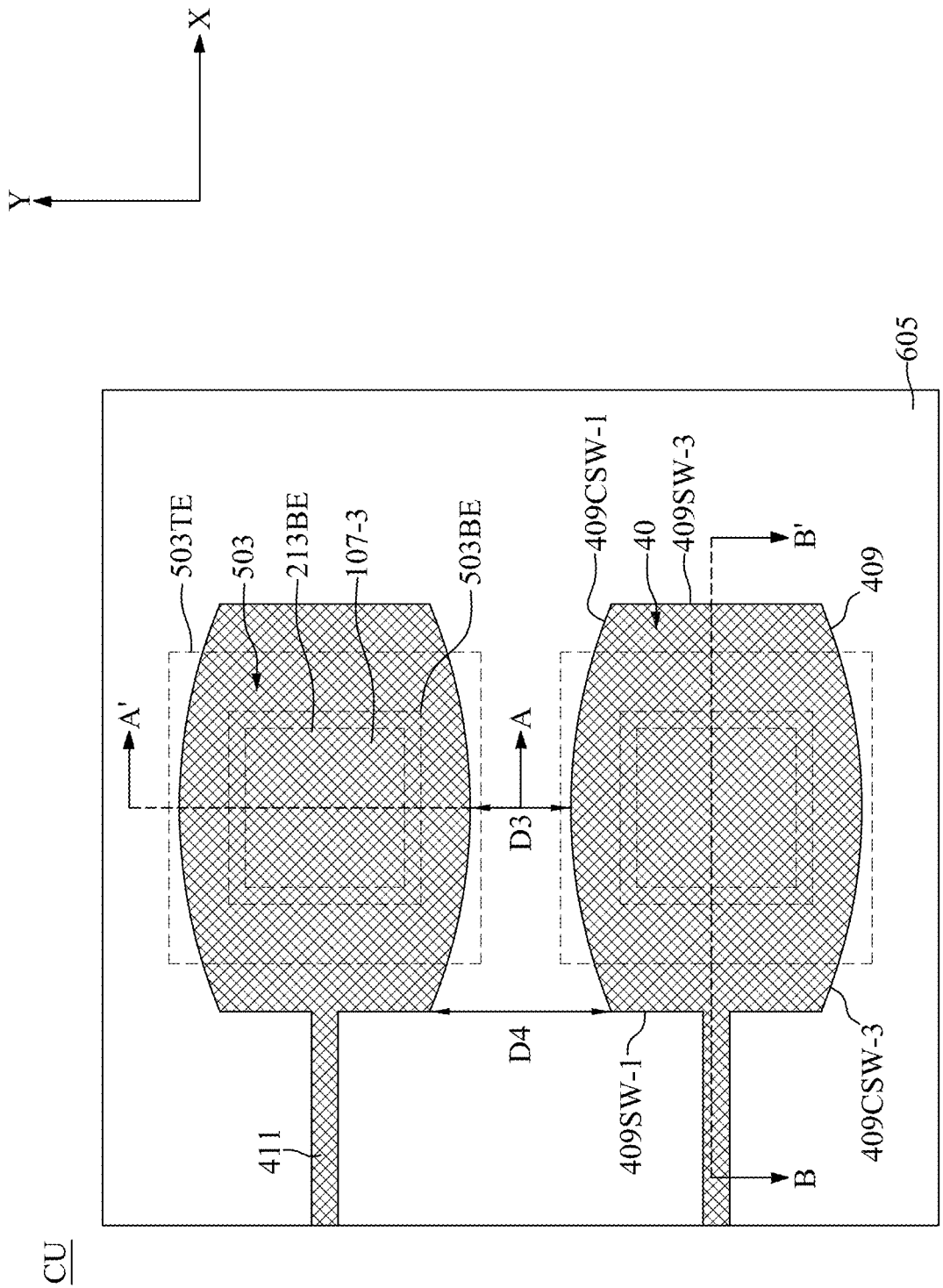
FIG. 30 illustrates, in a schematic close-up top-view diagram, an intermediate semiconductor device of the CU area in FIG. 29.
Figure 31:
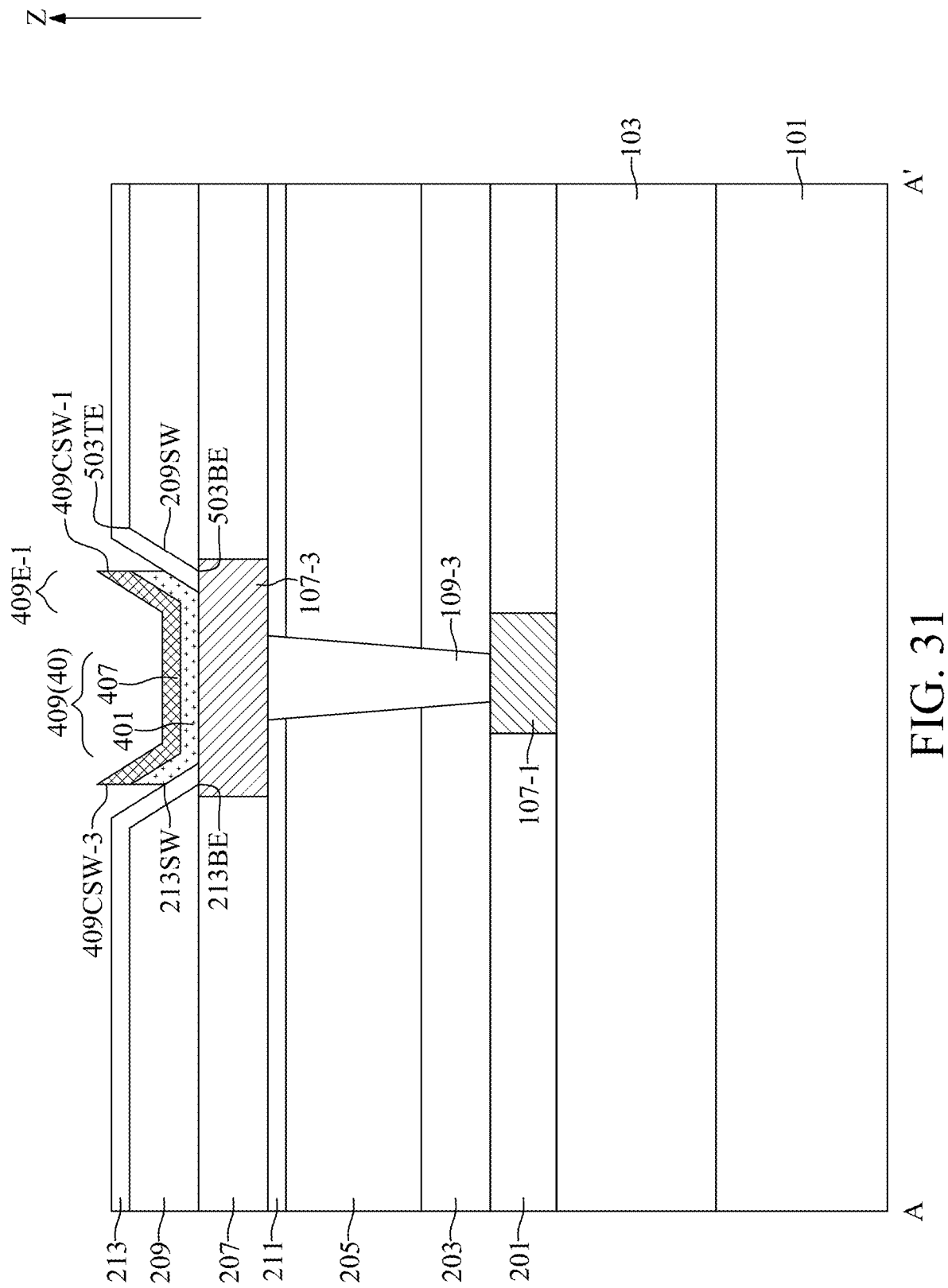
FIG. 31 is a schematic cross-sectional view diagram taken along the line A-A' in FIG. 30.
Figure 32:
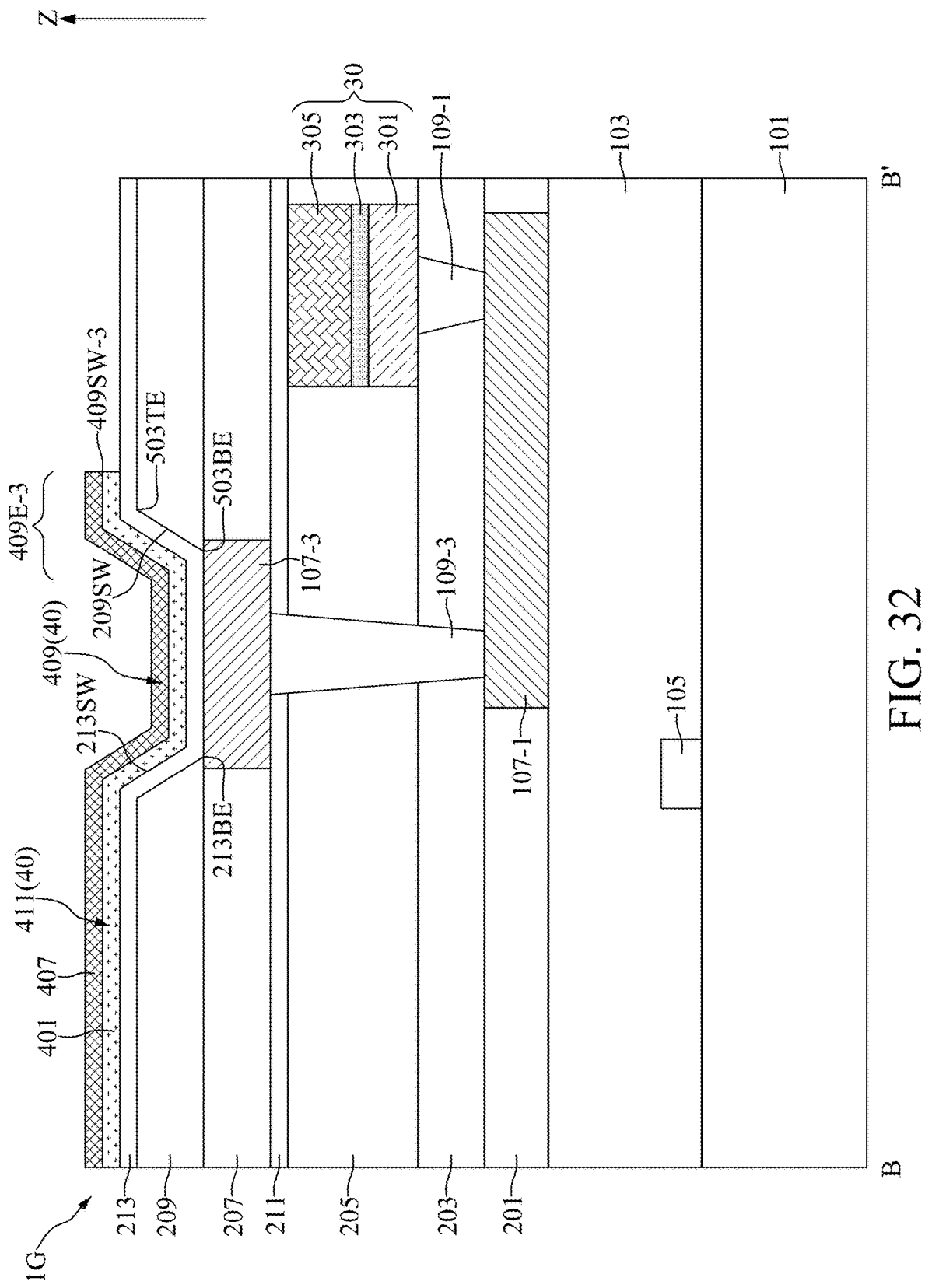
FIG. 32 is a schematic cross-sectional view diagram taken along the line B-B' in FIG. 30.

FIG. 29 illustrates, in a schematic top-view diagram, an intermediate semiconductor device in accordance with another embodiment of the present disclosure. FIG. 30 illustrates, in a schematic close-up top-view diagram, an intermediate semiconductor device of the CU area in FIG. 29 in accordance with another embodiment of the present disclosure. FIG. 31 is a schematic cross-sectional view diagram taken along the line A-A' in FIG. 30. FIG. 32 is a schematic cross-sectional view diagram taken along the line B-B' in FIG. 30.

With reference to FIG. 19 and FIGS. 29 to 32, at step S29, the redistribution structures 40 may be formed in the mask openings 605O.

With reference to FIGS. 29 to 32, the redistribution structures 40 may be formed in the mask openings 605O and electrically coupled to the second conductive layers 107-3. In a top-view perspective, each of the redistribution structure 40 may be a conductive pattern that extends from a first region R1 to a second region R2. The first region R1 may be spaced apart from the second region R2. In some embodiments, the first region R1 may correspond to a central region of the semiconductor device 1G and the second region R2 may correspond to a peripheral region or an edge region of the semiconductor device 1G.

With reference to FIGS. 29 and 30, in a top-view perspective, each of the redistribution structure 40 may include a redistribution overlapping portion 409, a redistribution connection portion 411, and a redistribution contact portion 413. The redistribution overlapping portion 409 may be arrayed in one column which is parallel with the direction Y and located in the first region R1. The redistribution contact portion 413 may be arrayed in one column which is parallel with the direction Y and located in the second region R2. The redistribution connection portion 411 may connect the redistribution overlapping portion 409 and the redistribution contact portion 413. The redistribution structures 40 may re-route the second conductive layers 107-3 to gain more space for wiring or bumping and prevent the second conductive layers 107-3 being affect by the stress of wiring or bumping.

With reference to FIGS. 31 and 32, in a cross-sectional perspective, each of the redistribution structure 40 may be formed of a stacked layer structure. In some embodiments, each of the redistribution structure 40 may include a redistribution conductive layer 401 and a thermal release layer 407. The thermal release layer 407 may be formed on the redistribution conductive layer 401. The redistribution conductive layer 401 may be formed of the lower portion of the redistribution overlapping portion 409, the lower portion of the redistribution connection portion 411, and the lower portion of the redistribution contact portion 413. The thermal release layer 407 may be formed of the upper portion of the redistribution overlapping portion 409, the upper portion of the redistribution connection portion 411, and the upper portion of the redistribution contact portion 413.

With reference to FIGS. 29 to 32, in a top-view perspective, the redistribution overlapping portion 409 may include a first curved sidewall 409CSW-1, a second curved sidewall 409CSW-3, a third sidewall 409SW-1, and a fourth sidewall 409SW-3. The first curved sidewall 409CSW-1 may be horizontally arranged and may have a convex shape. The second curved sidewall 409CSW-3 may be opposite to the first curved sidewall 409CSW-1 and may have a concave shape. The vertical distances parallel to the direction Y between the first curved sidewall 409CSW-1 of the redistribution overlapping portion 409 and the second curved sidewall 409CSW-3 of an adjacent redistribution overlapping portion 409 may vary between a relatively narrow distance D3 to a relatively wide distance D4 along the direction X. The third sidewall 409SW-1 may connect a first edge of the first curved sidewall 409CSW-1 to a first edge of the second curved sidewall 409CSW-3. The fourth sidewall 409SW-3 may connect a second edge of the first curved sidewall 409CSW-1 to a second edge of the second curved sidewall 409CSW-3. The third sidewall 409SW-1 and the fourth sidewall 409SW-3 may be flat to be parallel with the direction Y. The redistribution connection portion 411 may be connected the first sidewall 409SW-1.

With reference to FIGS. 29 to 32, in a cross-sectional perspective, the first curved sidewall 409CSW-1 may be located to overlap with the tapered sidewalls 213SW between the top edge 503TE and the bottom edge 503BE. Although most of the first curved sidewall 409CSW-1 is formed to overlap with the tapered sidewalls 213SW, both of the first edge and the second edge of the first curved sidewall 409CSW-1 may be located out of the top edge 503TE to overlap with the flat top surface of the covering layer 213.

With reference to FIG. 31, in a cross-sectional perspective, the redistribution overlapping portion 409 may include a first extension segment 409E-1 that extends from a bottom segment of the redistribution overlapping portion 409 to the first curved sidewall 409CSW-1. The bottom segment may be a part of the redistribution overlapping portion 409 that is in direct contact with the second conductive layer 107-3.

With reference to FIG. 32, the redistribution overlapping portion 409 may include a second extension segment 409E-3 that extends from the bottom segment to the second sidewall 409SW-3. The second extension segment 409E-3 may extend onto an outside region of the tapered sidewalls 213SW to overlap with the flat top surface of the covering layer 213.

With reference to FIGS. 29 to 32, the first extension segment 409E-1 and the second extension segment 409E-3 may cover both the bottom edge 213BE and the bottom edge 503BE. Thus, even though the redistribution overlapping portion 409 is shifted from a normal position due to a process variation or the like, the second conductive layer 107-3 may be still covered with the redistribution overlapping portion 409. That is, an overlap margin between the redistribution overlapping portion 409 and the second conductive layer 107-3 may increase to significantly suppress or reduce a failure that the second conductive layer 107-3 is exposed after the redistribution overlapping portion 409 is formed.

Due to the design of the semiconductor device of the present disclosure, the programmable unit 30 and the redistribution structure 40 may be integrated and may be served as a programmable feature. In addition, in the presence of the peak portion 307, the reliability of programming of the semiconductor device 1C may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a substrate;
   a first conductive layer positioned above the substrate;
   a bottom conductive layer positioned above the first conductive layer and electrically coupled to the first conductive layer;
   a programmable insulating layer positioned on the bottom conductive layer;
   a top conductive layer positioned on the programmable insulating layer;
   a redistribution structure positioned above the first conductive layer and electrically coupled to the first conductive layer; and
   a peak portion positioned on the bottom conductive layer, wherein the programmable insulating layer is positioned on the bottom conductive layer and the peak portion;
   wherein the bottom conductive layer, the programmable insulating layer, and the top conductive layer together configure a programmable unit.

2. The semiconductor device of claim 1, wherein the bottom conductive layer and the redistribution structure are at a same vertical level.

3. The semiconductor device of claim 2, wherein the bottom conductive layer and the programmable insulating layer have a same width.

4. The semiconductor device of claim 2, wherein a width of the programmable insulating layer is equal to or greater than a width of the bottom conductive layer.

5. A semiconductor device comprising:
   a substrate;
   a first conductive layer positioned above the substrate;
   a bottom conductive layer positioned above the first conductive layer and electrically coupled to the first conductive layer;
   a programmable insulating layer positioned on the bottom conductive layer;
   a top conductive layer positioned on the programmable insulating layer;
   a redistribution structure positioned above the first conductive layer and electrically coupled to the first conductive layer;
   wherein the bottom conductive layer, the programmable insulating layer, and the top conductive layer together configure a programmable unit;

wherein the redistribution structure is at a vertical level higher than a vertical level of the programmable unit;

wherein the redistribution structure comprises a redistribution conductive layer and a thermal release layer, the redistribution conductive layer is positioned above the first conductive layer and electrically coupled to the first conductive layer, and the thermal release layer is positioned on the redistribution conductive layer.

6. The semiconductor device of claim 5, wherein the redistribution conductive layer comprises a seed layer and a plating layer, the seed layer is positioned above the first conductive layer and electrically coupled to the first conductive layer, and the plating layer is positioned on the seed layer.

7. The semiconductor device of claim 6, wherein the thermal release layer comprises an organic material interstitially mingled with carbon nanotubes.

8. The semiconductor device of claim 6, wherein the thermal release layer comprises a fluoropolymer material interstitially mingled with carbon nanotubes.

9. The semiconductor device of claim 7, wherein an aspect ratio of the carbon nanotubes is between about 1:1 and about 1:100.

10. The semiconductor device of claim 9, further comprising a barrier layer positioned under the redistribution conductive layer, wherein the barrier layer is formed of titanium, titanium nitride, titanium silicon nitride, tantalum, tantalum nitride, tantalum silicon nitride, or a combination thereof.

11. The semiconductor device of claim 10, wherein a thickness of the barrier layer is between about 10 angstroms and about 15 angstroms.

12. The semiconductor device of claim 11, further comprising an adjustment layer positioned between the barrier layer and the redistribution conductive layer, wherein the adjustment layer is formed of graphene or graphite.

13. The semiconductor device of claim 12, wherein the thermal release layer is configured to sustain a thermal resistance between about 0.04° C. cm2/Watt and about 0.25° C. cm2/Watt.

14. The semiconductor device of claim 13, wherein the redistribution conductive layer is formed of tungsten, titanium, tin, nickel, copper, gold, aluminum, platinum, cobalt, or a combination thereof.

* * * * *